United States Patent
Kawai et al.

(10) Patent No.: US 6,953,756 B2
(45) Date of Patent: Oct. 11, 2005

(54) GLASS CERAMIC SINTERED BODY AND WIRING BOARD USING THE SINTERED BODY

(75) Inventors: Shinya Kawai, Kokubu (JP); Toshifumi Higashi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 27 days.

(21) Appl. No.: 10/692,406

(22) Filed: Oct. 22, 2003

(65) Prior Publication Data

US 2004/0087427 A1 May 6, 2004

(30) Foreign Application Priority Data

| Oct. 25, 2002 | (JP) | 2002-311828 |
| Nov. 15, 2002 | (JP) | 2002-332790 |
| Feb. 25, 2003 | (JP) | 2003-048240 |
| Apr. 24, 2003 | (JP) | 2003-120774 |

(51) Int. Cl.[7] .......................... C03C 10/08; C03C 14/00
(52) U.S. Cl. .............................. 501/9; 501/10; 501/32; 428/426
(58) Field of Search ............................... 501/9, 10, 32; 428/426

(56) References Cited

U.S. PATENT DOCUMENTS

| 4,714,687 A | * | 12/1987 | Holleran et al. | 501/9 |
| 5,001,086 A | * | 3/1991 | Carrier et al. | 501/9 |
| 5,756,408 A | * | 5/1998 | Terashi et al. | 501/8 |

FOREIGN PATENT DOCUMENTS

| JP | 04-058198 | | 9/1992 |
| JP | 4-321258 | * | 11/1992 |
| JP | 05-254923 | | 10/1993 |
| JP | 9-175853 | * | 7/1997 |

* cited by examiner

*Primary Examiner*—Karl Group
(74) *Attorney, Agent, or Firm*—Hogan & Hartson LLP

(57) ABSTRACT

A glass ceramic sintered body containing gahnite and cordierite as crystal phases, having a thermal expansion coefficient at 40 to 400° C. of not larger than $5 \times 10^{-6}/°$ C., a dielectric constant of not larger than 7 and a Young's modulus of not larger than 150 GPa. A wiring board having an insulating substrate made of the glass ceramic sintered body features very high reliability in the primary mounting and in the secondary mounting.

15 Claims, 1 Drawing Sheet

GLASS CERAMIC SINTERED BODY AND WIRING BOARD USING THE SINTERED BODY

BACKGROUND OF THE INVENTION

1. Field of the Invention

The present invention relates to a glass ceramic sintered body that is best suited as an insulating substrate in a wiring board used for packages for accommodating semiconductor devices (semiconductor packages), to a method of producing the glass ceramic sintered body and to a wiring board using the glass ceramic sintered body.

2. Description of the Related Art

In recent years of highly degree of information where information and communication technology is rapidly advancing, attempts have been made to further increase the speed and sizes of semiconductor devices. To meet these demands, it has also been desired that the wiring board used for the semiconductor packages have wiring layers of decreased resistance in the wiring board and a decreased dielectric constant to decrease transmission loss of signals. To fulfill the demand, there has been proposed a wiring board having an insulating substrate by using glass ceramics of a low dielectric constant, that can be densely formed upon firing at not higher than 1000° C. and that can be co-fired together with the wiring layer comprising a low-resistance metal such as copper, silver or gold as a chief component.

Here, semiconductor devices comprising chiefly silicon tend to exhibit decreasing mechanical strength as the devices are designed to operate at high speeds. When the semiconductor devices are mounted (primary mounting) on a package for accommodating semiconductor devices, therefore, a problem may arouse in that the semiconductor devices are destroyed due to thermal stress produced by mismatching in the thermal expansion-coefficient between the devices and the package. As the size of the device increases, further, the thermal stress increases correspondingly, and the devices become more probable to be damaged.

It has therefore been desired to decrease the thermal stress that affects the primary mounting by bringing the thermal expansion-coefficient of the package to meet the thermal expansion-coefficient (2 to $4\times10^{-6}/°$ C. at 40 to 400° C.) of silicon.

For example, Japanese Examined Patent Publication (Kokoku) No. 58198/1992 discloses a multi-layer ceramic circuit board having a small coefficient of thermal expansion by using, as an insulating material, a glass ceramic sintered body comprising mullite, quartz glass and borosilicate glass.

Further, Japanese Unexamined Patent Publication (Kokai) No. 254923/1993 discloses a ceramic insulating substrate having a small coefficient of thermal expansion capable of forming a wiring of low resistance by combining a borosilicate glass comprising $SiO_2$, $B_2O_3$, $K_2O$ and $Al_2O_3$ with alumina, cordierite or quartz glass.

The wiring board using the above-mentioned conventional glass ceramic sintered body as an insulating substrate realizes a small coefficient of thermal expansion and makes it possible to improve reliability of the primary mounting. When mounted (secondary mounting) on a mother board constituted by a printed wiring board having a very large coefficient of thermal expansion (e.g., about 15 to $20\times10^{-6}/°$ C.), however, mismatching in the the thermal expansion-coefficient becomes very great to impair reliability in the secondary mounting.

SUMMARY OF THE INVENTION

It is, therefore, an object of the present invention to provide a glass ceramic sintered body that can be co-fired together with a low-resistance metal such as silver, copper, gold or the like metal, has a small coefficient of thermal expansion, a low dielectric constant and a small Young's modulus, and is best suited as an insulating substrate capable of forming a wiring board maintaining high reliability of primary mounting as well as high reliability of secondary mounting, and a method of producing the same.

It is another object of the present invention to provide a wiring board having an insulating substrate made of the above-mentioned glass ceramic sintered body and a mounted structure thereof.

The present inventors have studied the above problems, have discovered that a glass ceramic sintered body obtained by firing a mixed powder of a filler powder and a glass powder containing $SiO_2$, $Al_2O_3$, MgO, ZnO and $B_2O_3$ at a predetermined ratio, has a small coefficient of thermal expansion, a low dielectric constant and a small Young's modulus, that a wiring board having an insulating substrate formed by using the glass ceramic sintered body having such properties features high reliability in the primary mounting as well as in the secondary mounting, and have finished the present invention.

According to the present invention, there is provided a glass ceramic sintered body containing cordierite and gahnite as crystal phases, having a thermal expansion-coefficient at 40 to 400° C. of not larger than $5\times10^{-6}/°$ C., a dielectric constant of not larger than 7 and a Young's modulus of not larger than 150 GPa.

According to the present invention, further, there is provided a method of producing a glass ceramic sintered body by mixing a glass powder having the following composition:

$SiO_2$: 30 to 55 mass %

$Al_2O_3$: 15 to 40 mass %

MgO: 3 to 25 mass %

ZnO: 2 to 15 mass %

$B_2O_3$: 2 to 15 mass % and a filler powder together to prepare a mixed powder containing not less than 59.5 mass % of the glass powder, forming an article by molding the mixed powder, and firing the article in the atmosphere or in a nitrogen atmosphere at a temperature of not higher than 1050° C.

According to the present invention, there is further provided a wiring board having wiring layers of a low-resistance metal arranged on a front surface and/or inside of the insulating substrate of the glass ceramic sintered body.

According to the present invention, there is further provided a mounted structure of a wiring board obtained by mounting the wiring board on a surface of a printed wiring board that has an insulating substrate containing an organic resin.

Figure 1:
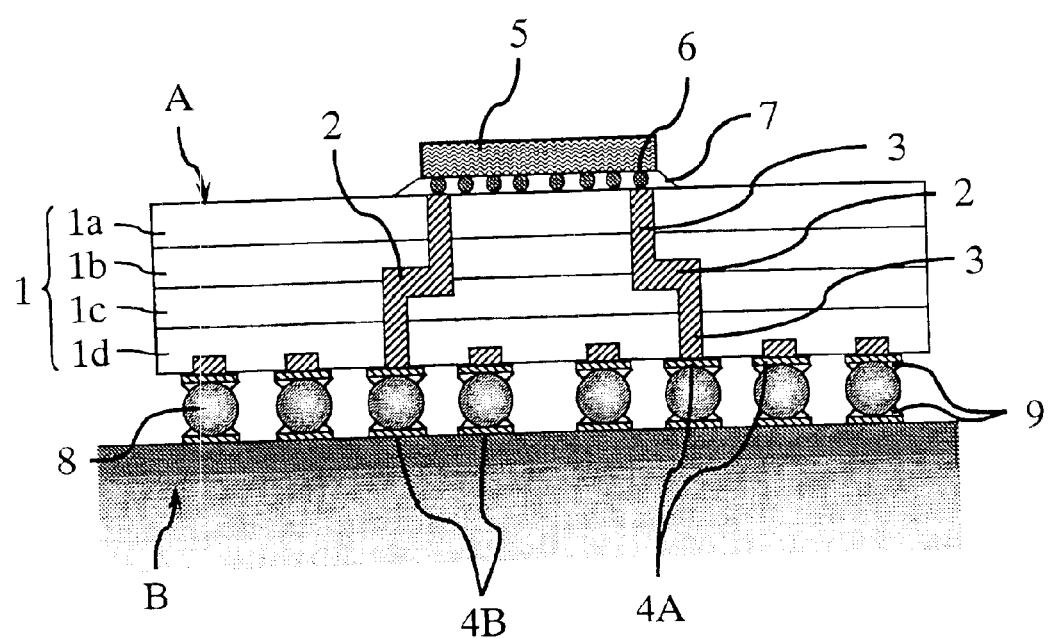
FIG. 1 is a sectional view schematically illustrating the structure of a wiring board having an insulating substrate made of a glass ceramic sintered body of the present invention of when it is used for package for accommodating a BGA-type semiconductor device mounted on a printed wiring board.

DETAILED DESCRIPTION OF THE INVENTION (Glass Ceramic Sintered Body)

A glass ceramic sintered body of the present invention is obtained by firing a mixed powder of a glass ceramic powder of a predetermined composition and a filler powder, and has an important feature in that it contains cordierite ($Mg_2Al_4Si_5O_{18}$) and gahnite ($ZnAl_2O_4$) as crystal phases, exhibiting a thermal expansion-coefficient at 40 to 400° C. of not larger than $5\times10^{-6}$/° C., particularly, not larger than $4.8\times10^{-6}$/° C. and, most desirably, not larger than $4.5\times10^{-6}$/° C., a dielectric constant of not larger than 7, particularly, not larger than 6.5 and, most desirably, not larger than 6, and a Young's modulus of not larger than 150 GPa, particularly, not larger than 140 GPa and, most desirably, not larger than 130 GPa, making it possible to decrease the thermal expansion-coefficient, dielectric constant and Young's modulus. Namely, the glass ceramic sintered body of the invention having the above properties is best suited for use as an insulating substrate in the wiring board (in the following description, the thermal expansion-coefficient is that of at 40 to 400° C.).

The thermal expansion-coefficient of the glass ceramic sintered body is close to, for example, the thermal expansion-coefficient (2 to $4\times10^{-6}$/° C.) of silicon. Therefore, the wiring board using the above glass ceramic sintered body as an insulating substrate produces a decreased thermal stress caused by the mismatching in the thermal expansion-coefficient between the insulating substrate and the semiconductor device at the time of primarily mounting the semiconductor device comprising chiefly silicon on the wiring board (insulating substrate). As a result, high reliability is maintained in the primary mounting. When the thermal expansion-coefficient of the glass ceramic sintered body is larger than the above range, reliability decreases in the primary mounting.

It is further desired that the dielectric constant is low to shorten the signal delay time in the wiring board. Even from this point of view, the glass ceramic sintered body of the present invention is suited for use as an insulating substrate in the wiring board. For example, if the dielectric constant of the insulating substrate is greater than the above range, the delay time of the wiring board becomes long to deteriorate the performance.

Further, a low Young's modulus means that the glass ceramic sintered body tends to be easily deformed by stress. That is, when the thermal expansion-coefficient of the insulating substrate is brought into match with that of the semiconductor device by lowering the thermal expansion-coefficient of the glass ceramic sintered body, a difference in the thermal expansion increases between the insulating substrate and the printed wiring board at the time of secondary mounting on the printed wiring board. By using the glass ceramic sintered body having a low Young's modulus as the insulating substrate, however, it is allowed to relax the thermal stress generated in the secondary mounting portion by utilizing the deformation of the insulating substrate making it possible to improve reliability in the secondary mounting. When, for example, the Young's modulus is greater than the above range, reliability in the secondary mounting is greatly deteriorated.

Further, the glass ceramic sintered body of the present invention can be obtained by firing at a low temperature (not higher than 1050° C.) owing to the properties of the glass ceramic, and can be co-fired together with a low-resistance metal such as silver, copper or gold. Therefore, formation of the wiring layer of such a low-resistance metal and fabrication of the insulating substrate can be done at one time by co-firing presenting great advantage even from the standpoint of production efficiency.

In the present invention, the cordierite crystal phase and the gahnite crystal phase are essential components for lowering the thermal expansion, for lowering the dielectric constant and for lowering the Young's modulus of the glass ceramic sintered body. In particular, it is desired that the cordierite crystal phase is present in the glass ceramic sintered body in an amount of not smaller than 20 mass %, particularly, not smaller than 25 mass % and, most desirably, not smaller than 30 mass %. When the content of the cordierite crystal phase is smaller than this range, it is probable that the thermal expansion-coefficient, dielectric constant or Young's modulus increases.

It is desired that the cordierite crystal phase and the gahnite crystal phase are at least partly precipitated from the glass powder. Namely, by using the cordierite and gahnite powders and by firing a mixed powder of these powders and a glass powder, the glass ceramic sintered body containing the cordierite crystal phase and the gahnite crystal phase can be obtained. In this case, however, it becomes difficult to conduct the firing at low temperatures or the Young's modulus tends to increase. Upon precipitating the cordierite crystal phase and the gahnite crystal phase from the glass powder, further, the flexural strength can be increased to be not smaller than 150 MPa offering advantage from the standpoint of maintaining mechanical reliability of the wiring board. In the present invention, the gahnite crystal phase, most desirably, is entirely precipitated from the glass powder. As for the cordierite crystal phase, however, it is desired that the cordierite crystal phase is partly precipitated from the glass powder and the remainder thereof is stemming from the filler powder which is separate from the glass powder, from the standpoint of promoting the precipitation of the cordierite crystal phase from the glass powder and increasing its content.

Further, the glass ceramic sintered body of the present invention uses the glass powder as a starting material and may contain PbO and $A_2O$ (A: alkali metal) as impurities. It is, however, desired that the contents of PbO and $A_2O$ are suppressed to be not larger than 0.1 mass %, respectively, from the standpoint of environment friendliness, resistance against chemicals and insulating property.

Further, the glass ceramic sintered body of the present invention may further contain crystal phases other than those of cordierite and gahnite as far as the above-mentioned properties are not lost. Upon selecting these other crystal phases, it is allowed to adjust the properties of the glass ceramic sintered body to become further suited for the insulating substrate.

For example, at least one kind selected from the group consisting of alumina($Al_2O_3$), spinel ($MgAl_2O_4$), mullite ($3Al_2O_3 \cdot 2SiO_2$), anorthite($CaAl_2Si_2O_8$), slawsonite ($SrAl_2Si_2O_8$) celsian($BaAl_2Si_2O_8$) and zirconia($ZrO_2$) can be contained as a crystal phase to further improve the flexural strength of the glass ceramic sintered body. In particular, mullite, anorthite, slawsonite or celsian stems from the filler powder that will be described later, and works not only to improve the flexural strength but also to further decrease the thermal expansion-coefficient or the dielectric constant and, particularly, to lower the thermal expansion-coefficient down to $4.5\times10^{-6}$/° C. or lower. The spinel is usually precipitated from the glass powder that will be described later by firing.

When alumina ($Al_2O_3$) or zirconia($ZrO_2$) is contained as another crystal phase, the flexural strength of the glass ceramic sintered body can be enhanced to be not smaller than 200 MPa and, besides, the resistance against chemicals can be increased. Here, the resistance against chemicals (chemical resistance) is an important property for avoiding a drop in the properties (discoloration, occurrence of stains, drop in the adhering strength of the wiring layers) caused by the plating at the time of forming wiring layers on the insulating substrate. To enhance the flexural strength and to improve chemical resistance, it is desired that the alumina or zirconia crystal phase is made present in the glass ceramic sintered body in an amount of 5 to 35 mass %, particularly, 8 to 33 mass % and, most desirably, 10 to 30 mass %.

Further, when enstatite ($MgSiO_3$) and forsterite ($2MgO \cdot SiO_2$) are contained as other crystal phases, it is allowed to greatly enhance the flexural strength of the glass ceramic sintered body. For example, by containing enstatite and/or forsterite and the above-mentioned cordierite crystal phase in a total amount of not less than 40 mass % in the glass ceramic sintered body, the flexural strength can be increased to be not smaller than 200 MPa and, particularly, not smaller than 240 MPa.

Further, the glass ceramic sintered body of the present invention may contain such crystal phases as $SiO_2$, $Ca_2MgSi_2O_7$, $Sr_2MgSi_2O_7$, $Ba_2MgSi_2O_7$, $ZnO$, $Zn_2SiO_4$, $Zn_2ZrO_4$, $CaMgSi_2O_6$, $Zn_2Al_4Si_5O_{18}$, $CaSiO_3$, $SrSiO_3$ and $BaSiO_3$ in a total amount of not larger than 15 mass %, particularly, not larger than 10 mass % and, more particularly, not larger than 5 mass % to thereby control sintering properties and characteristics of the glass ceramic sintered body.

The glass ceramic sintered body of the present invention is obtained by firing by using the glass powder. Namely, constituent components forming a portion of the glass powder are precipitated as crystals, and the remaining components exist as a glass phase. It is desired that CaO is existing in the remaining glass phase. Namely, during the firing, CaO is generated from the filler powder (CaO-releasing Ca compound) and dissolves in the glass phase. As will be described later in detail, the glass powder used in the present invention contains $B_2O_3$ as an essential component to lower the softening temperature and the melting temperature. $B_2O_3$ serves as a serious factor for lowering the chemical resistance of the sintered body. However, CaO that is dissolved in the glass phase as described above infiltrates predominantly into a three-coordinate network of $B_2O_3$ in the glass phase, causes the network of $B_2O_3$ to be changed into a four-coordinate network having excellent chemical resistance thereby to improve the chemical resistance of the sintered body. It is desired that CaO is present in the glass phase at a mass ratio $CaO/B_2O_3$ of not smaller than 0.01, particularly, not smaller than 0.03 and, most desirably, not smaller than 0.05. In the present invention, it is particularly desired that such CaO is present in the glass phase and that the above-mentioned alumina crystal phase is contained from the standpoint of chemical resistance. The glass ceramic sintered body exhibits excellent chemical resistance and, when immersed in a 1-mass % HF(hydrogen fluoride) aqueous solution for one minute, loses the weight by not larger than 3.0 $\mu g/mm^2$, particularly, not larger than 2.5 $\mu g/mm^2$ and, most desirably, not larger than 2.0 $\mu g/mm^2$. Namely, the processing such as Ni—Au plating or Cu—Au plating is executed at the time of forming wiring layers on the insulating substrate, and a HF treatment is carried out for removing the glass layer formed on the wiring layers. The HF treatment gives the greatest damage to the surface of the insulating substrate (to the surface of the sintered body) often causing the insulating substrate to be discolored, to develop stains, or causing a decrease in the adhesion of the wiring layers. However, the glass ceramic sintered body that permits the weight to decrease very small when immersed in the 1-mass % HF aqueous solution for one minute, exhibits a very high resistance against the treatment with chemicals, and effectively precludes inconvenience caused by the HF treatment.

(Method of Producing the Glass Ceramic Sintered Bodies)

To produce the above-mentioned glass ceramic sintered body, a mixed powder of the glass powder and the filler powder which are the starting powders, is formed into a slurry thereof for molding, and is molded into an article of a desired shape followed by firing at a temperature of not higher than 1050° C.

-Glass Powder-

The present invention uses a glass powder having at least the following composition:

$SiO_2$: 30 to 55 mass %, particularly, 35 to 50 mass %
$Al_2O_3$: 15 to 40 mass %, particularly, 20 to 35 mass %
MgO: 3 to 25 mass %, particularly, 5 to 20 mass %
ZnO: 2 to 15 mass %, particularly, 4 to 12 mass %
$B_2O_3$: 2 to 15 mass %, particularly, 4 to 12 mass %

The above glass powder is necessary for effecting the sintering at a low temperature of not higher than 1050° C. which is a temperature at which the low-resistance conductor such as copper, silver or gold is co-fired. With the glass powder being softened and fluidized, the sintering can be effected at a low temperature. In order for the cordierite crystal phase and gahnite crystal phase to be precipitated by firing, further, it is necessary to use the glass powder having the above-mentioned composition.

The amount of the glass powder in the mixed powder in which is contained the filler powder that will be described later, may vary depending upon the kind of the filler powder, but must be contained in the mixed powder in an amount of at least not smaller than 59.5 mass %, preferably, not smaller than 60 mass % and, particularly preferably, not smaller than 64.5 mass %. When the amount of the glass powder is small, the sintering cannot be effected at not higher than 1050° C. When the glass powder only is used, further, it becomes difficult to maintain the shape of the molded article. It is therefore desired that the amount of the glass powder in the mixed powder is not larger than 99 mass %, preferably, not larger than 94.5 mass % and, particularly preferably, not larger than 94 mass %.

The $SiO_2$ component in the glass powder is a network former of glass which is an essential component for precipitating, from the glass, the crystal phase (particularly, cordierite) that contains such $SiO_2$ as cordierite or mullite as a constituent component. When the amount of $SiO_2$ is smaller than the above range, the cordierite crystal phase is not precipitated in a sufficient amount, and it becomes difficult to obtain the glass ceramic sintered body having properties that lie within a desired range. When the amount of $SiO_2$ is greater than the above range, on the other hand, the softening temperature of the glass so rises that it becomes difficult to effect the firing at a low temperature of not higher than 1050° C.

The $Al_2O_3$ component in the glass powder works to improve the Young's modulus and chemical resistance of the glass, and is further indispensable for precipitating, from the glass, the crystal phase containing $Al_2O_3$ as constituent components, for example, cordierite, gahnite, spinel and mullite (particularly, cordierite and gahnite). When the amount of $Al_2O_3$ is smaller than the above range, the cordierite and gahnite crystal phases are not precipitated in sufficient amounts and it becomes difficult to obtain the glass ceramic sintered body having properties lying within a desired range. When the amount of $Al_2O_3$ is larger than the above range, on the other hand, the softening point of the glass so rises that it becomes difficult to conduct the firing at a low temperature of not higher than 1050° C. Besides, the Young's modulus of the glass ceramic sintered body becomes so great that it becomes difficult to maintain reliability of the secondary mounting.

The MgO component in the glass powder is indispensable for precipitating, from the glass, the crystal phase containing MgO as constituent components, for example, cordierite and spinel (particularly, cordierite). When the amount of MgO is smaller than the above range, the cordierite crystal phase is not precipitated in a sufficient amount and it becomes difficult to obtain the glass ceramic sintered body having properties lying within a desired range. When the amount of MgO is larger than the above range, on the other hand, the Young's modulus of the glass ceramic sintered body so rises that it becomes difficult to maintain reliability of the secondary mounting.

The ZnO component in the glass powder is indispensable for lowering the softening temperature of the glass and for precipitating the gahnite crystal phase from the glass. When the amount of ZnO is smaller than the above range, the gahnite crystal phase is not precipitated in a sufficient amount and it becomes difficult to obtain the glass ceramic sintered body having properties lying within a desired range. When the amount of ZnO is larger than the above range, on the other hand, the softening point of the glass decreases and it becomes difficult to maintain the shape of the glass ceramic sintered body and, besides, chemical resistance of the glass ceramic sintered body decreases to a conspicuous degree.

Further, the $B_2O_3$ component in the glass powder is a network former of glass and works to lower the softening temperature and the dissolving temperature. When the amount of $B_2O_3$ is smaller than the above range, the dissolving temperature of the glass so rises that it becomes difficult to inexpensively produce the glass ceramic sintered product on an industrial scale and, at the same time, the softening temperature of the glass so rises that it becomes difficult to effect the firing at a low temperature of not higher than 1050° C.

When the amount of $B_2O_3$ component is larger than the above range, on the other hand, the softening point of the glass decreases and it becomes difficult to maintain the shape of the molded article and, besides, chemical resistance of the glass ceramic sintered body decreases to a conspicuous degree.

So far as the amounts of these components lie within the above-mentioned ranges, the glass powder may further contain other components such as CaO, SrO, BaO, $ZrO_2$, $SnO_2$, oxides of rare earth elements and the like component in amounts of not larger than 10 mass %, particularly, not larger than 7 mass % and, more particularly, not larger than 5 mass %. Thus, the sintering property and characteristics of the glass ceramic sintered body can be finely adjusted.

Here, however, PbO and $A_2O$ (A: alkali metal) exert a large load against the environment and decreases the chemical resistance and the insulating property. It is, therefore, desired that the amounts of these components are suppressed to be not larger than 0.1 mass %, respectively, in the mixed powder.

-Filler Powder-

As the filler powder to be mixed to the above glass powder, there can be exemplified at least one kind of powder for adjusting basic properties (property-adjusting powder) selected from the group consisting of mullite, anorthite, slawsonite, celsian and quartz glass, as well as coardierite powder, alumina powder, CaO-releasing Ca compound powder, enstatite powder and forsterite powder, which may be suitably used in a single kind or in a combination of a plurality of kinds of them.

Among the filler powders exemplified above, the property-adjusting powder is particularly effective in lowering the thermal expansion coefficient and the dielectric constant of the glass ceramic sintered body. Among them, mullite, anorthite, slawsonite and celsian are effective in improving the flexural strength as described above, and quartz glass exhibits a particularly distinguished effect for lowering the thermal expansion coefficient, dielectric constant and Young's modulus. It is desired that the property-adjusting powder is contained in the mixed powder in an amount of 1 to 40 mass % and, particularly, 1 to 35 mass % so will not to impair the sintering property at low temperatures and such that the functions are exhibited to a sufficient degree. When used in combination with the alumina powder, enstatite powder or forsterite powder, further, it is desired that the content of the property-adjusting powder in the mixed powder is not larger than 20 mass %.

The cordierite powder is used for adjusting the amount of the cordierite crystal phase in the glass ceramic sintered body and exists by itself as the cordierite crystal phase, and works to precipitate the cordierite crystal phase in increased amounts from the glass. That is, the cordierite powder works as a nucleating agent at the time of firing, enabling the cordierite crystal phase to be precipitated in increased amounts from the glass. When, for example, the amount of cordierite precipitated by heat-treating the glass powder alone is denoted by X mass %, then, the amount of cordierite (Z mass %) contained in the sintered body obtained by firing the mixed powder (mixed powder of glass powder and filler powder) containing the cordierite powder in an amount of Y mass %, satisfies a relation Z>X+Y.

By using the cordierite powder as described above, the amount (Z mass %) of cordierite in the sintered body can be increased to lie in a range of, for example, not smaller than 20 mass %, particularly, not smaller than 25 mass % and, most particularly, not smaller than 30 mass %. The content (Y mass %) of such cordierite powder in the mixed powder can be selected to lie in a range of 0.5 to 20 mass %, preferably, 1 to 18 mass % and, most preferably, 2 to 15 mass %.

Upon being made present in the crystal phase as described above, further, the alumina powder works to increase the flexural strength of the glass ceramic sintered body to be not smaller than 200 MPa as well as to increase chemical resistance. The alumina powder is usually made present in the mixed powder in an amount of 5 to 35 mass %, particularly, 8 to 33 mass % and, most particularly, 10 to 30 mass %. When the alumina powder alone is used as a filler powder, however, the glass ceramic sintered body tends to exhibit an increased coefficient of thermal expansion. It is, therefore, desired that the alumina powder is used in combination with the cordierite powder described above.

The CaO-releasing Ca compound powder releases CaO when it is being fired. The CaO dissolves in the glass and transforms $B_2O_3$ that deteriorates chemical resistance into a four-coordinate structure that exhibits good chemical resistance. As the CaO-releasing Ca compound, there can be used an inorganic salt such as oxide, halide, hydroxide, carbonate or oxalate. In particular, it is desired to use at least one kind of oxide selected from the group consisting of $CaSiO_3$, $CaZrO_3$, $Ca_2SiO_4$, $CaAl_2O_4$, $CaAl_4O_7$ and $CaAl_2SiO_6$.

Among them, it is most desired to use $CaSiO_3$ and/or $CaZrO_3$. In order that a good chemical resistance is exhibited, it is desired that the CaO-releasing Ca compound powder is used in an amount calculated as CaO of not smaller than 0.01 mass times, particularly, not smaller than 0.03 mass times and, most particularly, not smaller than 0.05 mass times with respect to $B_2O_3$ in the glass powder. In other words, it is desired that the mass ratio ($CaO/B_2O_3$) of Cao released from the Ca compound and $B_2O_3$ in the glass powder is not smaller than 0.01, particularly, not smaller than 0.03 and, most particularly, not smaller than 0.05. In general, therefore, the CaO-releasing Ca compound powder is made present in the mixed powder in an amount of 0.5 to 15 mass %, particularly, 1 to 12 mass % and, most particularly, 10 to 30 mass %. When the CaO-releasing Ca compound powder is used in combination with the alumina powder, the most increased resistance is exhibited against chemicals, and the reduction of weight can be suppressed to lie in the above-mentioned smallest range when the glass ceramic sintered body is immersed in the 1-mass % HF aqueous solution for one minute.

Further, the enstatite powder and the forsterite powder work to markedly improve the flexural strength of the glass ceramic sintered body. To increase the flexural strength to be not smaller than 200 MPa and, particularly, not smaller than 240 MPa, it is desired that the enstatite powder and/or the forsterite powder are made present in an amount of 5 to 40 mass % and, particularly, 7 to 35 mass % in the mixed powder. To effectively lower the thermal expansion coefficient, dielectric constant and Young's modulus of the glass ceramic sintered body, further, it is desired that the enstatite powder and/or the forsterite powder are used in combination with the above-mentioned cordierite powder. For example, the cordierite powder and the enstatite powder and/or the forsterite powder are made present in the mixed powder in a total amount of not smaller than 40 mass %. When the enstatite powder or the forsterite powder is used, further, it is desired that the above-mentioned alumina powder and the property-adjusting powder are used in an amount of not larger than 20 mass %, preferably, not larger than 17 mass % and, most preferably, not larger than 15 mass % in the mixed powder.

In the present invention as described above, one or two or more fillers are used in combination being blended with the glass powder to obtain the glass ceramic sintered body having desired properties. Described below are representative examples of combinations of various filler powders and the glass powder.

Combination (1): Glass powder—property-adjusting powder
Combination (2): Glass powder—property-adjusting powder—cordierite powder
Combination (3): Glass powder—cordierite powder—alumina powder—CaO-releasing Ca compound powder
Combination (4): Glass powder—cordierite powder—alumina powder—enstatite powder and/or forsterite powder Among them, the combination (3) is most desired from the standpoint of obtaining a glass ceramic sintered body having the most excellent properties.

Further, so far as the predetermined amount of glass powder is maintained and sintering property at low temperatures is not impaired, there can be used filler powders other than those described above. For example, there can be used oxide powders selected from the group consisting of $SiO_2$, $Ca_2MgSi_2O_7$, $Sr_2MgSi_2O_7$, $Ba_2MgSi_2O_7$, $ZrO_2$, $ZnO$, $Zn_2SiO_4$, $Zn_2ZrO_4$, $CaMgSi_2O_6$, $Zn_2Al_4Si_5O_{18}$, $CaSiO_3$, $SrSiO_3$ and $BaSiO_3$ in a total amount of not larger than 15 mass %, particularly, not larger than 10 mass % and, more particularly, not larger than 5 mass % being contained in the mixed powder in order to finely adjust the sintering property and characteristics of the glass ceramic sintered body.

-Molding-

To the mixed powder of the glass powder and the filler powder are further added an organic binder, a solvent and, as required, a plasticizer, which are, then, mixed together to prepare a slurry for molding. The slurry for molding is, then, molded into a desired shape by known molding means, such as press molding, extrusion molding, injection molding, cast molding or tape molding.

-Firing-

The molded article obtained above is subjected to the binder-removing treatment at 450 to 750° C., and is fired in an oxidizing atmosphere or in a nitrogen atmosphere at a temperature of not higher than 1050° C., particularly, 700 to 1000° C. and, more particularly, 800 to 950° C. to prepare a glass ceramic sintered body of the present invention.

When a wiring layer is to be formed by using silver or gold while using the glass ceramic sintered body as the insulating substrate of the wiring board that will be described later, the firing can be carried out in the open atmosphere since the conductor is not oxidized. When the wiring layer is to be formed by using copper, however, it is desired that the firing is carried out in a nitrogen atmosphere to suppress the oxidation of copper.

The firing can be conducted in a reducing atmosphere. From the standpoint of cost and safety, however, it is desired to carry out the firing in an oxidizing atmosphere or in a nitrogen atmosphere.

In order to promote the precipitation of the cordierite crystal phase and the gahnite crystal phase, further, it is desired that the temperature elevating rate after the binder-removing treatment is 50° C./hour higher and, particularly, 100° C./hour. It is also desired that the firing temperature is maintained for 0.02 to 10 hours and, particularly, 0.2 to 2 hours.

(Wiring Board)

The glass ceramic sintered body obtained as described above has a small coefficient of thermal expansion, low dielectric constant and low Young's modulus and, further, has excellent mechanical strength (flexural strength) and chemical resistance, and is best suited for use as an insulating substrate in the wiring board. For example, the wiring board equipped with the above-mentioned glass ceramic insulating substrate offers excellent primary mount reliability in mounting a semiconductor device comprising chiefly silicon and, further, offers excellent secondary mount reliability in mounting the wiring board on a printed board. Further, the glass ceramic sintered body can be co-fired together with the wiring layer containing at least one kind of a low-resistance metal selected from the group consisting of copper, silver and gold, offering advantage from the standpoint of productivity and very high industrial utility.

The structure of the wiring board equipped with the insulating substrate of the above-mentioned glass ceramic sintered body will now be described with reference to FIG. 1 which illustrates a package for accommodating an electric device of the BGA (ball grid array) type on which a device such as a semiconductor device comprising chiefly silicon is mounted by flip-chip mounting.

Referring to FIG. 1 which is a sectional view schematically illustrating the package mounted (secondary mounting) on the printed wiring board, the package A for accommodating the electric device has wiring layers 2 formed on the surface and/or inside of the insulating substrate 1 which comprises a plurality of insulating layers 1a to 1d, the wiring layers 2 being electrically connected together through via-hole conductors 3.

The insulating layers 1a to 1d are made of the above-mentioned glass ceramic sintered body of the invention, and the wiring layers 2 and the via-hole conductors 3 are made of at least one kind of a low-resistance metal selected from the group consisting of copper, silver and gold.

Further, a plurality of connection electrodes 4A are arranged on the lower surface of the package A. At the central portion on the upper surface of the insulating substrate 1, an electric device 5 such as a semiconductor device is adhered and secured on the insulating substrate 1 by the flip-chip mounting via solder balls 6 and is, further, electrically connected to the package A.

In order to enhance the reliability of primary mounting, further, an underfill 7 containing a thermosetting resin is injected into between the electric device 5 and the package A. Upon curing the underfill 7, the electric device 5 is firmly secured. Further, the electric device 5 is electrically connected to a plurality of connection electrodes 4A formed on the lower surface of the insulating substrate 1 through the solder balls 6, wiring layers 2 and via-hole conductors 3.

On the other hand, a printed wiring board B is formed on the upper surface of the insulating substrate having a thermal expansion coefficient at 40 to 400° C. of 15 to $20\times10^{-6}$/° C. in a manner that the connection electrodes 4B and the connection electrodes 4A form pairs. The connection electrodes 4A and 4B are electrically connected together through a eutectic solder 9 and high-melting solder balls 8.

According to the present invention, the insulating substrate 1 comprising the insulating layers 1a to 1d is made of the above-mentioned glass ceramic sintered body having a thermal expansion coefficient of not larger than $5\times10^{-6}$/° C. and a Young's modulus of not larger than 150 GPa, offering high reliability of primary mounting on the package A as well as high reliability of secondary mounting. Further, the insulating substrate 1 has a dielectric constant of as low as 7 or smaller and, besides, the wiring layers 2 and the via-hole conductors 3 are made of a low-resistance conductor such as copper, silver or gold. Therefore, a delay of signals is decreased.

FIG. 1 has illustrated the silicon semiconductor device as the electric device 5. However, the wiring board of the present invention can further be preferably used even for mounting other electric devices having coefficients of thermal expansion of not larger than $5\times10^{-6}$/° C. Further, the package of FIG. 1 is preferably adapted to a case where the device 5 is connected to the wiring layers 2 through the solder balls 6. Here, however, the device 5 and the wiring layers 2 may be connected together by bonding wires. Further, the device 5 may be of the form that is covered with a sealing resin. Further, a recessed portion such as a cavity may be formed in the insulating substrate 1 to accommodate the device 5, and the cavity may be air-tightly sealed with a closure.

FIG. 1 has illustrated a package structure of the BGA type in which the package A and the printed wiring board B are connected together through high-melting solder balls. The invention, however, can also be preferably applied to the packages of the BGA, LGA and LCC types in which the package A and the printed wiring board B are connected together through a solder without using lead pins. That is, in these packages, a large stress occurs in the secondary mounting, and reliability is required in the secondary mounting. The present invention, however, offers greatly improved reliability in the secondary mounting. The present invention is effectively applied even to those packages that are connected by using resin-containing balls, pole-like solder columns, resin-containing columns or pins, as a matter of course.

Next, a method of producing the wiring board of the invention will be described with reference to the case of the above package A.

That is, by using the mixed powder of the predetermined glass powder and the filler powder, green sheets (sheet-like molded articles) are formed that correspond to the insulating resin layers 1a to 1d. As required, through holes are formed in the sheet-like molded articles and are filled with a conducting paste containing at least one kind of a low-resistance metal selected from the group consisting of copper, silver and gold. Then, by using the conducting paste, wiring patterns are printed maintaining a thickness of 5 to 30 μm on the surfaces of the sheet-like molded articles by a known printing method such as screen printing method or gravure printing method.

Then, the plurality of sheet-like molded articles are positioned, laminated, adhered with pressure, and are subjected to the binder-removing treatment in the atmosphere or in a nitrogen atmosphere, and are fired at not higher than 1050° C. in the atmosphere or in the nitrogen atmosphere to prepare a wiring board.

When silver or gold is used as the conductor material, it is desired that the firing is conducted in the atmosphere since the conductor is not oxidized. When copper is used, it is desired that the firing is conducted in the nitrogen atmosphere to suppress the oxidation of copper.

Then, the electric device 5 such as a semiconductor device is mounted on the surface of the wiring board, and is so connected that the signals can be transmitted to the wiring layers 2. The connection method may be, as described above, the flip-chip mounting by using solder balls, wiring bonding, or a connection by being directly mounted on the wiring layers.

Further, a gap between the semiconductor device 5 and the wiring board A is filled with the underfilling agent 7 which is, then, cured. Or, the device is coated with a potting resin which is, then, cured. Or, a closure made of the same insulating material as the insulating substrate A, other insulating material or a metal having good heat-radiating property, is joined with an adhesive such as glass, resin or brazing material to thereby produce a package for accommodating the device.

Balls 8 of a high-melting solder are connected to the lower surface of the wiring board A by using a low-melting solder. When the wiring board A is to be mounted on the printed wiring board B, the solder balls 8 of the wiring board A are placed via the low-melting solder on the wiring layers 4B on the surface of the printed wiring board B, and the wiring board A is secondarily mounted on the printed wiring board B by the solder reflow treatment.

Experiments

The invention will now be described by way of Experiments.

In the following Experiments, there were prepared powders of glasses A to F having compositions shown in Table 1 and having an average particle size of 2 μm. The amounts of the cordierite crystal phase precipitated when the glass powders were each heat-treated at a firing temperature were measured by the Liedbert's method to obtain the results as shown in Table 1.

TABLE 1

(Glass powders)

| | SiO$_2$ | Al$_2$O$_3$ | MgO | ZnO | B$_2$O$_3$ | CaO | BaO | ZrO$_2$ | Precipitated amount of Cordierite crystals |
|---|---|---|---|---|---|---|---|---|---|
| A | 40 | 32 | 7 | 10 | 11 | 0 | 0 | 0 | 11 |
| B | 44 | 29 | 11 | 7 | 9 | 0 | 0 | 0 | 18 |
| C | 45 | 22 | 18 | 6 | 9 | 0 | 0 | 0 | 25 |
| D | 44 | 28 | 11 | 5 | 5 | 6 | 1 | 0 | 21 |
| E | 28 | 10 | 0 | 16 | 16 | 0 | 28 | 2 | 0 |
| F | 24 | 7 | 2 | 22 | 13 | 32 | 0 | 0 | 0 |

(mass %)

The coefficients of thermal expansion, dielectric constants, Young's moduli and flexural strengths of the sintered bodies in the following Experiments, were measured as described below.

Thermal Expansion Coefficient:

The sintered body was machined into a size of 2 mm×2 mm×18 mm, and a change in the size was measured by using a laser distance-measuring instrument while raising the temperature at a rate of 10° C./min. to thereby measure a thermal expansion coefficient at 40 to 400° C.

Dielectric Constant:

The sintered body was machined into a size of 50 mm×50 mm×1.0 mm, and a dielectric constant was measured at 2 GHz by a cavity resonator method.

Young's Modulus:

The sintered body was machined into a size of 3 mm×4 mm×40 mm, and a Young's modulus was measured by an ultrasonic pulse method.

Flexural Strength:

The sintered body was machined into a size of 3 mm×4 mm×40 mm, and a three-point flexural strength was measured in compliance with JISR-1601 by using an Autograph.

(Experiment 1-1)

Filler powders (average particle size of 1 to 2 μm) shown in Tables 2-1 and 2-2 were mixed into the glass powders A to F of Table 1 to accomplish compositions shown in Tables 2-1 and 2-2.

An organic binder, a plasticizer and toluene were added to the mixtures to prepare slurries thereof which were, then, formed into green sheets having a thickness of 300 μm by a doctor blade method. The green sheets were laminated in a plurality of number of pieces to obtain a desired thickness, and were thermally adhered together at a temperature of 60° C. with a pressure of 10 MPa.

The obtained laminates were put to the binder-removing treatment in a nitrogen atmosphere at 750° C., and fired in the atmosphere under the conditions of Tables 2-1 and 2-2 while elevating the temperature at a rate of 200° C./hour to thereby obtain glass ceramic sintered bodies (samples Nos. 1 to 38).

For comparison, further, an AiN sintered body (sample No. 39) was prepared.

The above sintered bodies were measured for their thermal expansion coefficients at 40 to 400° C., dielectric constants, Young's moduli and flexural strengths. The results were as shown in Tables 3-1 and 3-2. Further, crystal phases in the sintered bodies of samples Nos. 1 to 38 were identified from the X-ray diffraction measurement. The results of main peak intensities arranged in order of decreasing intensities were as shown in Tables 3-1 and 3-2.

TABLE 2-1

| Sample No. Note 1) | Glass powder | | Filler powder | | Firing condition | |
|---|---|---|---|---|---|---|
| | Kind | (mass %) | Kind | (mass %) | Temp. (° C.) | Time (hr) |
| 1 | A | 90 | mullite | 10 | 950 | 1 |
| 2 | A | 80 | mullite | 20 | 950 | 1 |
| 3 | A | 90 | anorthite | 10 | 900 | 1 |
| 4 | A | 80 | anorthite | 20 | 950 | 1 |
| 5 | A | 70 | anorthite | 30 | 950 | 1 |
| 6 | A | 60 | anorthite | 40 | 1000 | 5 |
| * 7 | A | 58 | anorthite | 42 | 1000 | 5 |
| * 8 | B | 99.5 | mullite | 0.5 | 850 | 1 |
| 9 | B | 99 | mullite | 1 | 850 | 1 |
| 10 | B | 95 | mullite | 5 | 900 | 1 |
| 11 | B | 90 | mullite | 10 | 900 | 1 |
| 12 | B | 80 | mullite | 20 | 950 | 1 |
| 13 | B | 90 | anorthite | 10 | 900 | 1 |
| 14 | B | 80 | anorthite | 30 | 900 | 1 |
| 15 | B | 90 | slawsonite | 10 | 900 | 1 |
| 16 | B | 70 | slawsonite | 30 | 900 | 1 |
| 17 | B | 90 | celsian | 10 | 900 | 1 |
| 18 | B | 70 | celsian | 30 | 900 | 1 |
| 19 | B | 90 | quartz glass | 10 | 900 | 1 |
| 20 | B | 70 | quartz glass | 30 | 900 | 1 |
| * 21 | B | 90 | ZrO2 | 10 | 900 | 1 |
| * 22 | B | 70 | ZrO2 | 30 | 900 | 1 |
| * 23 | B | 90 | TiO2 | 10 | 900 | 1 |
| * 24 | B | 70 | TiO2 | 30 | 900 | 1 |

Note 1)
Samples marked with * lie outside the scope of the invention.

TABLE 2-2

| Sample No. Note 1) | Glass powder Kind | (mass %) | Filler powder Kind | (mass %) | Firing condition Temp. (° C.) | Time (hr) |
|---|---|---|---|---|---|---|
| 25 | C | 90 | mullite | 10 | 900 | 1 |
| 26 | C | 80 | mullite | 20 | 900 | 1 |
| 27 | C | 90 | anorthite | 10 | 900 | 1 |
| 28 | C | 70 | anorthite | 30 | 900 | 1 |
| 29 | C | 90 | quartz glass | 10 | 900 | 1 |
| 30 | C | 70 | quartz glass | 30 | 900 | 1 |
| 31 | D | 90 | mullite | 10 | 950 | 1 |
| 32 | D | 90 | anorthite | 10 | 950 | 1 |
| 33 | D | 90 | quartz glass | 10 | 950 | 1 |
| 34 | D | 70 | quartz glass | 30 | 950 | 1 |
| * 35 | E | 90 | quartz glass | 10 | 900 | 1 |
| * 36 | E | 70 | quartz glass | 30 | 900 | 1 |
| * 37 | F | 90 | quartz glass | 10 | 900 | 1 |
| * 38 | F | 70 | quartz glass | 30 | 900 | 1 |
| * 39 | | | AlN | | — | — |

Note 1)
Samples marked with * lie outside the scope of the invention

TABLE 3-1

| Sample No. Note 1) | Coefficient of thermal expansion ($\times 10^{-6}/°$ C.) | Dielectric constant | Young's modulus (GPa) | Flexural strength (MPa) | Precipitated crystal phase Note 2) | Temperature cycle test Primary mount | Temperature cycle test Secondary mount |
|---|---|---|---|---|---|---|---|
| 1 | 4.2 | 6.2 | 122 | 240 | Mu > Co > Ga | OK | OK |
| 2 | 4.0 | 6.1 | 128 | 250 | Mu > Co > Ga | OK | OK |
| 3 | 4.4 | 6.6 | 119 | 240 | An > Co > Ga | OK | OK |
| 4 | 4.5 | 6.6 | 125 | 240 | An > Co > Ga | OK | OK |
| 5 | 4.6 | 6.7 | 133 | 250 | An > Co > Ga | OK | OK |
| 6 | 4.7 | 6.8 | 141 | 240 | An > Co > Ga | OK | OK |
| * 7 | not sintered, could not be evaluated | | | | | | |
| * 8 | sintered body could not hold the shape, could not be evaluated | | | | | | |
| 9 | 4.1 | 6.0 | 115 | 200 | Co > Mu > Ga | OK | OK |
| 10 | 4.1 | 6.0 | 116 | 200 | Co > Mu > Ga | OK | OK |
| 11 | 4.0 | 5.9 | 118 | 220 | Mu > Co > Ga | OK | OK |
| 12 | 3.9 | 5.8 | 122 | 230 | Mu > Co > Ga | OK | OK |
| 13 | 4.4 | 6.3 | 115 | 200 | An > Co > Ga | OK | OK |
| 14 | 4.5 | 6.5 | 128 | 230 | An > Co > Ga | OK | OK |
| 15 | 4.4 | 6.2 | 113 | 200 | Su > Co > Ga | OK | OK |
| 16 | 4.5 | 6.2 | 115 | 210 | Su > Co > Ga | OK | OK |
| 17 | 4.2 | 6.4 | 118 | 230 | Ce > Co > Ga | OK | OK |
| 18 | 4.3 | 6.5 | 133 | 260 | Ce > Co > Ga | OK | OK |
| 19 | 3.8 | 5.7 | 109 | 170 | Co > Ga > Mu | OK | OK |
| 20 | 3.3 | 5.0 | 95 | 150 | Co > Ga > Mu | OK | OK |
| * 21 | 5.2 | 6.2 | 125 | 250 | Co > ZO > Ga | 900 | OK |
| * 22 | 6.2 | 8.8 | 144 | 290 | ZO > Co > Ga | 800 | OK |
| * 23 | 5.5 | 6.8 | 117 | 150 | Co > TO > Ga | 900 | OK |
| * 24 | 6.4 | 12.6 | 128 | 160 | TO > Co > Ga | 700 | OK |

Note 1)
Samples marked with * lie outside the scope of the invention
Note 2)
Mu: mullite
Co: cordierite
Ga: gahnite
An: anorthite
Su: surausonite
ZO: zirconia
TO: titania
Ce: celsian
AK: akermanite

TBLE 3-2

| Sample No. Note 1) | Coefficient of thermal expansion (×10⁻⁶/° C.) | Dielectric constant | Young's modulus (GPa) | Flexural strength (MPa) | Precipitated crystal phase Note 2) | Temperature cycle test Primary mount | Temperature cycle test Secondary mount |
|---|---|---|---|---|---|---|---|
| 25 | 4.0 | 5.7 | 120 | 230 | Mu > Co > Ga | OK | OK |
| 26 | 3.9 | 5.6 | 125 | 250 | Mu > Co > Ga | OK | OK |
| 27 | 4.4 | 6.1 | 115 | 220 | An > Co > Ga | OK | OK |
| 28 | 4.5 | 6.3 | 130 | 270 | An > Co > Ga | OK | OK |
| 29 | 3.7 | 5.5 | 110 | 180 | Co > Ga > Mu | OK | OK |
| 30 | 3.2 | 4.9 | 98 | 160 | Co > Ga > Mu | OK | OK |
| 31 | 4.2 | 5.9 | 119 | 230 | Mu > Co > Ga | OK | OK |
| 32 | 4.6 | 6.2 | 118 | 210 | An > Co > Ga | OK | OK |
| 33 | 3.8 | 5.6 | 105 | 190 | Co > Ga > Mu | OK | OK |
| 34 | 3.5 | 5.4 | 95 | 160 | Co > Ga > Mu | OK | OK |
| * 35 | 8.5 | 7.2 | 155 | 330 | Ce > Ga | 100 | 900 |
| * 36 | 7.8 | 6.9 | 138 | 270 | Ce > Ga | 300 | OK |
| * 37 | 7.9 | 7.4 | 137 | 270 | Ak > Ga | 300 | OK |
| * 38 | 7.4 | 7.0 | 120 | 240 | Ak > Ga | 400 | OK |
| * 39 | 4.7 | 8.7 | 310 | 400 | AlN | OK | 700 |

Note 1)
Samples marked with * lie outside the scope of the invention
Note 2)
Mu: mullite
Co: cordierite
Ga: gahnite
An: anorthite
Su: surausonite
ZO: zirconia
TO: titania
Ce: celsian
AK: akermanite As will be clear from the results of Tables 3-1 and 3-2, the samples Nos. 1 to 16, 9 to 20, and 25 to 34 in which particular crystal phases are precipitated inclusive of the cordierite crystal phase and the gahnite crystal phase according to the present invention, exhibited good values, i.e., the coefficients of thermal expansion of not larger than 5 ppm/° C., dielectric constants not larger than 7, Young's moduli of not larger than 150 GPa, and flexural strengths of not smaller than 150 MPa.

On the other hand, the sample No. 8 containing the glass powder in an amount of more than 99 mass % permitted the glass to be softened and flow, and could not hold the shape of the sintered body. Therefore, the sample No. 8 could not be evaluated. Further, the sample No. 7 containing the glass powder in an amount of smaller than 59 mass % could not form a densely sintered body through the firing at 1050° C.

Further, the samples Nos. 21 to 24 using $ZrO_2$ and $TiO_2$ as filler powders all exhibited the coefficients of thermal expansion of larger than 5 ppm/° C.

The samples Nos. 35 to 38 using glass powders E and F did not contain the cordierite crystal phase, and exhibited coefficients of thermal expansion which were larger than 5 ppm/° C.

(Experiment 1-2)

An acrylic binder, a plasticizer and toluene were added and mixed to the starting powders (mixed powders) used for the samples Nos. 1 to 6, 9 to 20 and 25 to 34 of Experiment 1-1, to prepare green sheets having a thickness of 250 μm by the doctor blade method. Next, via-holes were formed in the green sheets at predetermined positions and were filled with a conducting paste comprising chiefly copper. Then, by using the conducting paste, wiring patterns were formed on the surfaces of the green sheets by the screen printing method.

Four pieces of the green sheets were positioned, laminated, and were adhered with pressure. The laminates were subjected to the binder-removing treatment in water vapor-containing nitrogen at 750° C. and were, then, heated at a rate of 200° C./hour and were fired at 950° C. in nitrogen to prepare multi-layer wiring boards having wiring layers comprising chiefly copper.

The obtained wiring boards were confirmed for the conduction of the wiring layers. Good conduction property was exhibited having small resistance without breakage.

(Experiment 1-3)

Green sheets having wiring patterns and via-holes filled with the conducting paste were prepared by using the starting powders (mixed powders) of samples Nos. 1 to 38 in the same manner as in Experiment 1-2, and were laminated such that the thickness after firing was 1.5 mm. A flip-chip pad having pads 0.12 mm in diameter arranged like a matrix was printed on the surface of the laminate by the screen printing method, and a ball pad having pads 1 mm in diameter arranged like a matrix was formed on the back surface thereof. The laminates of the green sheets were cut into 30 mm×30 mm, and were fired under the conditions shown in Tables 2-1 and 2-2 to obtain wiring boards. The wiring layers were plated with an Ni—Au plating. Then, a eutectic solder paste was printed onto the ball pads, high-melting solder balls 1.2 mm in diameter were positioned and placed thereon followed by reflow treatment to obtain packages A mounting high-melting solder balls.

Next, a semiconductor device comprising chiefly silicon (coefficient of thermal expansion, $3 \times 10^{-6}$/° C.) was placed on the surface of the package A so as to be positioned on the solder balls, followed by the reflow treatment. Then, an underfilling agent comprising an epoxy resin was injected into a gap between the semiconductor device and the package A and was cured to mount the semiconductor device through the flip-chip.

Then, printed wiring boards B (coefficient of thermal expansion, $15 \times 10^{-6}$/° C.) forming the same wiring patterns as those of the package A were prepared. The packages A were positioned and placed thereon followed by the reflow treatment thereby to prepare twenty secondarily mounted samples mounting the packages A on the printed wiring boards B.

The secondarily mounted samples were subjected to the temperature cycle testing over a temperature range of 0 to 100° C. Resistances were measured both on the primarily mounted side and on the secondarily mounted side every after the completion of 100 cycles, and the presence of breakage was confirmed. The numbers of cycles at which the breakage has occurred were as shown in Tables 3-1 and 3-2. The samples without breakage up to 1000 cycles were regarded to be acceptable (OK).

Further, a package was prepared by using the AlN ceramics (coefficient of thermal expansion, $4.7 \times 10^{-6}/°$ C.; Young's modulus, 310 GPa) of sample No. 39 as an insulating substrate, by forming wiring layers and via conductors by using tungsten, and co-firing them at 1600° C. The package was subjected to the same temperature cycle testing to obtain results as shown in Table 3-2.

As will be clear from the results of Tables 3-1 and 3-2, in the samples Nos. 1 to 6, 9 to 20 and 25 to 34 (coefficients of thermal expansion, $5 \times 10^{-6}/°$ C. or smaller; Young's moduli, 150 GPa or smaller) precipitating particular crystal phases according to the present invention, no breakage was observed after 1000 cycles of the temperature cycle testing on either the primarily mounted side or the secondarily mounted side, and highly reliable mounting was confirmed.

In the samples Nos. 21 to 24 and 35 to 38 having coefficients of thermal expansion of larger than $5 \times 10^{-6}/°$ C., on the other hand, a large mismatching in the coefficient of thermal expansion has occurred between the semiconductor device and the insulating substrate in the temperature cycle testing, breakage has occurred in all samples after a number of cycles shorter than 1000 cycles, and reliability was not maintained in the primary mounting.

In the case of the sample No. 39 using AlN and having a thermal expansion coefficient of as low as $4.7 \times 10^{-6}/°$ C. but having a Young's modulus of as high as 310 GPa, no breakage was observed on the primary mounting side after 1000 cycles of the temperature cycle testing. However, since the Young's modulus was high and the thermal stress was not relaxed to a sufficient degree, the breakage occurred on the secondarily mounted side after a number of cycles smaller than 1000 cycles, and reliability in the mounting was not maintained.

(Experiment 2-1)

Filler powders (average particle size of 1 to 2 $\mu$m) shown in Tables 4-1 and 4-2 were mixed into the glass powders A to F of Table 1 to accomplish compositions shown in Tables 4-1 and 4-2.

Glass ceramic sintered bodies (samples Nos. 1 to 41) were obtained in the same manner as in Experiment 1-1 but using the above mixtures and conducting the firing under the conditions shown in Tables 4-1 and 4-2.

The above sintered bodies were measured for their coefficients of thermal expansion at 40 to 400° C., dielectric constants, Young's moduli and flexural strengths. The results were as shown in Tables 5-1 and 5-2. Further, crystal phases in the sintered bodies of samples Nos. 1 to 38 were identified from the X-ray diffraction measurement. The results of main peak intensities arranged in order of decreasing intensities were as shown in Tables 5-1 and 5-2.

As for the cordierite crystal phase, there were calculated the amount X of cordierite crystals precipitated from the glass depending upon the amount of addition of glass and the amount Y of the cordierite powder that was added. Further, as for the obtained sintered bodies, the content Z of the cordierite crystal phase was calculated by the Liedbert's method. The results of measurement were as shown in Tables 5-1 and 5-2.

TABLE 4-1

| Sample No. Note 1) | Glass powder Kind | (mass %) | Cordierite powder (mass %) | Filler powder Kind | (mass %) | Firing conditions Temp. (° C.) | Time (hr) |
|---|---|---|---|---|---|---|---|
| 1 | A | 87.5 | 2.5 | mullite | 10 | 950 | 1 |
| 2 | A | 77.5 | 2.5 | mullite | 20 | 950 | 1 |
| 3 | A | 85 | 5 | mullite | 10 | 950 | 1 |
| * 4 | A | 99.4 | 0.1 | anorthite | 0.5 | 850 | 1 |
| 5 | A | 87.5 | 2.5 | anorthite | 10 | 950 | 1 |
| 6 | A | 67.5 | 2.5 | anorthite | 30 | 950 | 1 |
| 7 | A | 65 | 5 | anorthite | 30 | 1000 | 1 |
| 8 | A | 67.5 | 17.5 | anorthite | 15 | 1000 | 1 |
| * 9 | A | 62.5 | 7.5 | anorthite | 30 | 1000 | 5 |
| 10 | A | 64.5 | 0.5 | anorthite | 35 | 1000 | 5 |
| * 11 | A | 59 | 1 | anorthite | 40 | 1000 | 5 |
| * 12 | A | 67.5 | 22.5 | anorthite | 10 | 1000 | 5 |
| * 13 | B | 99.4 | 0.1 | mullite | 0.5 | 850 | 1 |
| 14 | B | 98.5 | 0.5 | mullite | 1 | 850 | 1 |
| 15 | B | 89.5 | 0.5 | mullite | 10 | 900 | 1 |
| 16 | B | 87.5 | 2.5 | mullite | 10 | 900 | 1 |
| 17 | B | 87.5 | 7.5 | mullite | 5 | 900 | 1 |
| 18 | B | 87.5 | 2.5 | anorthite | 10 | 900 | 1 |
| 19 | B | 72.5 | 2.5 | anorthite | 25 | 900 | 1 |
| 20 | B | 87.5 | 2.5 | surausonite | 10 | 900 | 1 |
| 21 | B | 72.5 | 2.5 | surausonite | 25 | 900 | 1 |
| 22 | B | 87.5 | 2.5 | celsian | 10 | 900 | 1 |
| 23 | B | 72.5 | 2.5 | celsian | 25 | 900 | 1 |
| 24 | B | 87.5 | 2.5 | quartz glass | 10 | 900 | 1 |
| 25 | B | 72.5 | 2.5 | quartz glass | 25 | 900 | 1 |

Note 1)
Samples marked with * lie outside the scope of the invention.

TABLE 4-2

| Sample No. Note 1) | Glass powder Kind | (mass %) | Cordierite powder (mass %) | Filler powder Kind | (mass %) | Firing conditions Temp. (° C.) | Time (hr) |
|---|---|---|---|---|---|---|---|
| * 26 | B | 70 | 0 | ZrO2 | 30 | 900 | 1 |
| * 27 | B | 77.5 | 2.5 | ZrO2 | 20 | 900 | 1 |
| * 28 | B | 75 | 5 | ZrO2 | 20 | 900 | 1 |
| * 29 | B | 70 | 0 | TiO2 | 30 | 900 | 1 |
| * 30 | B | 77.5 | 2.5 | TiO2 | 20 | 900 | 1 |
| * 31 | B | 75 | 5 | TiO2 | 20 | 900 | 1 |
| 32 | C | 85 | 5 | mullite | 10 | 900 | 1 |
| 33 | C | 85 | 5 | anorthite | 10 | 900 | 1 |
| 34 | C | 85 | 5 | quartz glass | 10 | 900 | 1 |
| 35 | D | 85 | 5 | mullite | 10 | 950 | 1 |
| 36 | D | 85 | 5 | anorthite | 10 | 950 | 1 |
| 37 | D | 85 | 5 | quartz glass | 10 | 950 | 1 |
| * 38 | E | 90 | 0 | quartz glass | 10 | 900 | 1 |
| * 39 | E | 85 | 5 | quartz glass | 10 | 900 | 1 |
| * 40 | F | 90 | 0 | quartz glass | 10 | 900 | 1 |
| * 41 | F | 85 | 5 | quartz glass | 10 | 900 | 1 |

Note 1)
Samples marked with * lie outside the scope of the invention.

TABLE 5-1

| Sample No. Note 1) | Coefficient of thermal expansion ×10$^{-6}$ (/° C.) | Dielectric constant | Young's modulus (GPa) | Flexural strength (MPa) | Precipitated crystal phase | Amount of cordierite crystal phase | | | Number of cycles until broken | |
|---|---|---|---|---|---|---|---|---|---|---|
| | | | | | | X (mass %) | Y (mass %) | Z (mass %) | Primary mount | Secondary mount |
| 1 | 3.2 | 5.3 | 117 | 250 | Co > Ga > Mu | 9.625 | 2.5 | 25 | OK | OK |
| 2 | 3.0 | 3.2 | 124 | 250 | Co > Mu > Ga | 8.525 | 2.5 | 25 | OK | OK |
| 3 | 3.1 | 5.2 | 113 | 240 | Co > Ga > Mu | 9.35 | 5 | 28 | OK | OK |
| * 4 | sintered body could not hold the shape, could not be evaluated | | | | | | | | | |
| 5 | 3.4 | 5.7 | 114 | 240 | Co > Ga > An | 9.625 | 2.5 | 25 | OK | OK |
| 6 | 3.5 | 5.8 | 128 | 260 | An > Co > Ga | 7.425 | 2.5 | 25 | OK | OK |
| 7 | 3.4 | 5.8 | 125 | 250 | An > Co > Ga | 7.15 | 5 | 28 | OK | OK |
| 8 | 3.1 | 5.6 | 115 | 220 | Co > An > Ga | 7.425 | 17.5 | 40 | OK | OK |
| * 9 | not sintered, could not be evaluated | | | | | | | | | |
| 10 | 4.2 | 6.0 | 136 | 240 | An > Co > Ga | 7.095 | 1 | 23 | OK | OK |
| * 11 | not sintered, could not be evaluated | | | | | | | | | |
| * 12 | not sintered, could not be evaluated | | | | | | | | | |
| * 13 | sintered body could not hold the shape, could not be evaluated | | | | | | | | | |
| 14 | 3.3 | 5.2 | 113 | 210 | Co > Ga > Mu | 17.73 | 0.5 | 46 | OK | OK |
| 15 | 3.2 | 5.1 | 115 | 210 | Co > Ga > Mu | 16.11 | 0.5 | 46 | OK | OK |
| 16 | 3.1 | 5.0 | 112 | 230 | Co > Ga > Mu | 15.75 | 2.5 | 51 | OK | OK |
| 17 | 2.9 | 4.9 | 106 | 210 | Co > Ga > Mu | 15.75 | 7.5 | 56 | OK | OK |
| 18 | 3.1 | 5.1 | 111 | 210 | Co > Ga > An | 15.75 | 2.5 | 50 | OK | OK |
| 19 | 3.2 | 4.9 | 124 | 230 | Co > An > Ga | 13.05 | 2.5 | 50 | OK | OK |
| 20 | 3.1 | 4.8 | 109 | 210 | Co > Ga > Su | 15.75 | 2.5 | 50 | OK | OK |
| 21 | 3.2 | 4.9 | 111 | 220 | Co > Su > Ga | 13.05 | 2.5 | 50 | OK | OK |
| 22 | 3.2 | 5.1 | 113 | 240 | Co > Ga > Ce | 15.75 | 2.5 | 48 | OK | OK |
| 23 | 3.2 | 5.3 | 126 | 270 | Co > Ce > Ga | 13.05 | 2.5 | 48 | OK | OK |
| 24 | 2.6 | 4.7 | 107 | 190 | Co > Ga > Mu | 15.75 | 2.5 | 50 | OK | OK |
| 25 | 2.3 | 4.5 | 92 | 170 | Co > Ga > Mu | 13.05 | 2.5 | 50 | OK | OK |

Note 1)
Samples marked with * lie outside the scope of the invention
Note 2)
Mu: mullite
Co: cordierite
Ga: gahnite
An: anorthite
Su: surausonite
ZO: zirconia
TO: titania
Ce: celsian
AK: akermanite

TABLE 5-2

| Sample No. Note 1) | Coefficient of thermal expansion ×10⁻⁶ (/° C.) | Dielectric constant | Young's modulus (GPa) | Flexural strength (MPa) | Precipitated crystal phase | Amount of cordierite crystal phase | | | Number of cycles until broken | |
|---|---|---|---|---|---|---|---|---|---|---|
| | | | | | | X (mass %) | Y (mass %) | Z (mass %) | Primary mount | Secondary mount |
| * 26 | 6.2 | 8.8 | 144 | 290 | ZO > Co > Ga | 12.6 | 0 | 18 | 800 | OK |
| * 27 | 4.9 | 8.8 | 139 | 270 | Co > ZO > Ga | 13.95 | 2.5 | 50 | OK | OK |
| * 28 | 4.9 | 8.8 | 137 | 260 | Co > ZO > Ga | 13.5 | 5 | 53 | OK | OK |
| * 29 | 6.4 | 8.8 | 128 | 160 | TO > Co > Ga | 12.6 | 0 | 18 | 700 | OK |
| * 30 | 4.9 | 8.8 | 123 | 150 | Co > TO > Ga | 13.95 | 2.5 | 50 | OK | OK |
| * 31 | 4.8 | 8.8 | 120 | 150 | Co > TO > Ga | 13.5 | 5 | 53 | OK | OK |
| 32 | 3.0 | 4.9 | 117 | 230 | Co > Ga > Mu | 21.25 | 5 | 62 | OK | OK |
| 33 | 4.2 | 5.2 | 109 | 230 | Co > Ga > An | 21.25 | 5 | 60 | OK | OK |
| 34 | 2.6 | 4.7 | 92 | 180 | Co > Ga > Mu | 21.25 | 5 | 60 | OK | OK |
| 35 | 3.2 | 5.0 | 116 | 230 | Co > Ga > Mu | 17.85 | 5 | 51 | OK | OK |
| 36 | 4.4 | 5.3 | 113 | 220 | Co > Ga > An | 17.85 | 5 | 50 | OK | OK |
| 37 | 2.7 | 4.7 | 98 | 190 | Co > Ga > Mu | 17.85 | 5 | 50 | OK | OK |
| * 38 | 8.5 | 7.2 | 155 | 330 | Ce > Ga | 0 | 0 | 0 | 100 | 900 |
| * 39 | 8.3 | 7.1 | 152 | 280 | Ce > Ga > Co | 0 | 5 | 5 | 200 | 900 |
| * 40 | 7.9 | 7.4 | 137 | 270 | Ak > Ga | 0 | 0 | 0 | 300 | OK |
| * 41 | 7.7 | 7.2 | 134 | 250 | Ak > Ga > Co | 0 | 5 | 5 | 300 | OK |

Note 1)
Samples marked with * lie outside the scope of the invention
Note 2)
Mu: mullite
Co: cordierite
Ga: gahnite
An: anorthite
Su: surausonite
ZO: zirconia
TO: titania
Ce: celsian
AK: akermanite As will be clear from the results of Tables 5-1 and 5-2, the samples Nos. 1 to 3, 5 to 8, 10, 14 to 25 and 32 to 37 in which particular crystal phases are precipitated inclusive of the cordierite crystal phase, exhibited good values, i.e., the thermal expansion coefficients of not larger than 4.5 ppm/° C., dielectric constants of not larger than 7, Young's moduli of not larger than 150 GPa, and flexural strengths of not smaller than 150 MPa.

On the other hand, the samples Nos. 4 and 13 containing the glass powder in large amounts and the filler powder in small amounts permitted the glass to be softened and flow, and could not hold the shape of the sintered bodies. Therefore, the samples could not be evaluated. Further, the samples Nos. 9 and 11 containing the glass powder in small amounts and the sample No. 12 containing the cordierite powder in a large amount, could not form densely sintered bodies through the firing at not higher than 1050° C.

Further, samples Nos. 26 to 31 using $ZrO_2$ and $TiO_2$ as filler powders all exhibited thermal expansion coefficients of larger than 5 ppm/° C.

Samples Nos. 35 to 38 using glass powders E and F did not contain the cordierite crystal phase, and exhibited thermal expansion coefficients which were larger than 5 ppm/° C. or dielectric constants of larger than 7.

Further, in the samples Nos. 38 to 41 using the glass powders E and F, the cordierite crystal phase was not precipitated from the glass, and thermal expansion coefficients were larger than 5 ppm/° C.

(Experiment 2-2)

Multi-layer wiring boards were prepared in the same manner as in Experiment 1-2 with the exception of using the starting powders (mixed powders) of the samples Nos. 1 to 3, 5 to 8, 10, 14 to 25, and 32 to 37 in Experiment 2-1 and conducting the firing under the conditions shown in Tables 4-1 and 4-2.

The obtained wiring boards were confirmed for the conduction of the wiring layers. Good conduction property was exhibited having small resistance without breakage.

(Experiment 2-3)

Secondarily mounted samples having the package mounted on the printed board were produced in a number of 20 in the same manner as in Experiment 1-3 with the exception of using the starting powders (mixed powders) of the samples Nos. 1 to 41 in Experiment 2-1 and effecting the firing under the conditions of Tables 4-1 and 4-2, and were subjected to the same temperature cycle testing as that of Experiment 1-3. The results were as shown in Tables 5-1 and 5-2.

As will be clear from the results of Tables 5-1 and 5-2, the samples (thermal expansion coefficients, $5 \times 10^{-6}/°$ C. or smaller; Young's moduli, 150 GPa or smaller) precipitating particular crystal phases did not exhibit breakage in either the primarily mounted side or the secondarily mounted side even after the temperature cycle testing of 1000 cycles, offering high mounting reliability.

In the samples having thermal expansion coefficients of larger than $5 \times 10^{-6}/°$ C., mismatching in the thermal expansion coefficient between the semiconductor device and the insulating substrate was so large in the temperature cycle testing that breakage occurred after numbers of cycles smaller than 1000 cycles, and reliability in the primary mounting could not be maintained.

(Experiment 3-1)

Filler powders (average particle size of 1 to 2 μm) shown in Tables 6-1 and 6-2 were mixed into the glass powders A to F of Table 1 to accomplish compositions shown in Tables 6-1 and 6-2.

The glass ceramic sintered bodies (samples No. 1 to 53) were obtained in the same manner as in Experiment 1-1 with the exception of using the above mixtures and conducting the firing under the conditions shown in Tables 6-1 and 6-2.

The above sintered bodies were measured for their thermal expansion coefficients at 40 to 400°°C., dielectric constants, Young's moduli and flexural strengths. The results were as shown in Tables 7-1 and 7-2. Further, crystal phases in the sintered bodies of the samples were identified from the X-ray diffraction measurement. The results of main peak intensities arranged in order of decreasing intensities were as shown in Tables 7-1 and 7-2.

As for the cordierite crystal phase, there were calculated the amount X of cordierite crystals precipitated from the glass depending upon the amount of addition of glass and the amount Y of the cordierite powder that was added. Further, as for the obtained sintered bodies, the content Z of the cordierite crystal phase was calculated by the Liedbert's method. The results of measurement were as shown in Tables 7-1 and 7-2.

Further, the molded articles of before the firing were machined into a size of about 20 mm×about 20 mm×about 1 mm, fired, and the surface areas of the fired surfaces and weights were measured. Then, the molded articles were immersed in a 1-mass % HF aqueous solution for one minute, washed with water, dried, and were measured for their weights. Values obtained by dividing the reductions of weights by the surface areas were calculated as the amounts of elution in the HF aqueous solution. The results were as shown in Tables 7-1 and 7-2.

TABLE 6-1

| Sample No. Note 1) | Glass powder Kind | Glass powder (mass %) | Cordierite powder (mass %) | Alumina powder (mass %) | CaO-releasing filler powder Kind | CaO-releasing filler powder (mass %) | Filler powder Kind | Filler powder (mass %) | Firing conditions Temp. (° C.) | Firing conditions Time (hr) | Ratio of CaO/$B_2O_3$ |
|---|---|---|---|---|---|---|---|---|---|---|---|
| * 1 | A | 96.8 | 0.1 | 3 | $CaZrO_3$ | 0.1 | — | 0 | 850 | 1 | 0.003 |
| * 2 | A | 82.4 | 0.1 | 15 | $CaZrO_3$ | 2.5 | — | 0 | 900 | 1 | 0.086 |
| 3 | A | 93.5 | 1 | 3 | $CaZrO_3$ | 2.5 | — | 0 | 850 | 1 | 0.076 |
| 4 | A | 83.9 | 1 | 15 | $CaZrO_3$ | 0.1 | — | 0 | 900 | 1 | 0.003 |
| 5 | A | 94 | 0.5 | 5 | $CaZrO_3$ | 0.5 | — | 0 | 850 | 1 | 0.015 |
| 6 | A | 77.5 | 2.5 | 17.5 | $CaZrO_3$ | 2.5 | — | 0 | 900 | 1 | 0.091 |
| 7 | A | 77.5 | 2.5 | 17.5 | $CaSiO_3$ | 2.5 | — | 0 | 900 | 1 | 0.091 |
| 8 | A | 77.5 | 10 | 10 | $CaSiO_3$ | 2.5 | — | 0 | 900 | 1 | 0.091 |
| 9 | A | 60 | 20 | 17.5 | $CaSiO_3$ | 2.5 | — | 0 | 1000 | 3 | 0.118 |
| * 10 | A | 59 | 21 | 17.5 | $CaSiO_3$ | 2.5 | — | 0 | 1000 | 5 | 0.120 |
| 11 | A | 70 | 2.5 | 25 | $CaSiO_3$ | 2.5 | — | 0 | 950 | 1 | 0.101 |
| 12 | A | 60 | 2.5 | 35 | $CaSiO_3$ | 2.5 | — | 0 | 1000 | 3 | 0.118 |
| * 13 | A | 59 | 2.5 | 36 | $CaSiO_3$ | 2.5 | — | 0 | 1000 | 5 | 0.120 |
| 14 | A | 75 | 2.5 | 17.5 | $CaSiO_3$ | 5 | — | 0 | 900 | 1 | 0.189 |
| 15 | A | 70 | 2.5 | 17.5 | $CaSiO_3$ | 10 | — | 0 | 950 | 1 | 0.405 |
| 16 | A | 60 | 5 | 20 | $CaSiO_3$ | 15 | — | 0 | 1000 | 3 | 0.709 |
| * 17 | A | 59 | 5 | 20 | $CaSiO_3$ | 16 | — | 0 | 1000 | 5 | 0.769 |
| 18 | B | 76 | 1 | 20 | $CaZrO_3$ | 3 | — | 0 | 900 | 1 | 0.112 |
| 19 | B | 84.5 | 2.5 | 10 | $CaZrO_3$ | 3 | — | 0 | 900 | 1 | 0.101 |
| 20 | B | 79 | 2.5 | 17.5 | $CaZrO_3$ | 1 | — | 0 | 900 | 1 | 0.036 |
| 21 | B | 77 | 2.5 | 17.5 | $CaZrO_3$ | 3 | — | 0 | 900 | 1 | 0.111 |
| 22 | B | 74.5 | 2.5 | 20 | $CaZrO_3$ | 3 | — | 0 | 900 | 1 | 0.114 |
| 23 | B | 77 | 5 | 15 | $CaZrO_3$ | 3 | — | 0 | 900 | 1 | 0.111 |
| 24 | B | 72 | 5 | 20 | $CaZrO_3$ | 3 | — | 0 | 900 | 1 | 0.118 |
| 25 | B | 77 | 2.5 | 17.5 | $CaSiO_3$ | 3 | — | 0 | 900 | 1 | 0.171 |
| 26 | B | 75 | 2.5 | 17.5 | $Ca_2SiO_4$ | 5 | — | 0 | 900 | 1 | 0.197 |
| 27 | B | 75 | 2.5 | 17.5 | $CaAl_2O_4$ | 5 | — | 0 | 900 | 1 | 0.215 |

Note 1)
Samples marked with * lie outside the scope of the invention
Note 2)
Mu: mullite
Co: cordierite
Ga: gahnite
An: anorthite
Su: surausonite
ZO: zirconia
TO: titania
Ce: celsian
AK: akermanite

TABLE 6-2

| Sample No. Note 1) | Glass powder Kind | Glass powder (mass %) | Cordierite powder (mass %) | Alumina powder (mass %) | CaO-releasing filler Powder Kind | CaO-releasing filler Powder (mass %) | Filler powder Kind | Filler powder (mass %) | Firing conditions Temp. (° C.) | Firing conditions Time (hr) | Ratio of CaO/$B_2O_3$ |
|---|---|---|---|---|---|---|---|---|---|---|---|
| 28 | B | 74.5 | 2.5 | 15 | $CaZrO_3$ | 3 | mullite | 5 | 900 | 1 | 0.114 |
| 29 | B | 74.5 | 2.5 | 5 | $CaZrO_3$ | 3 | mullite | 15 | 900 | 1 | 0.114 |
| 30 | B | 74.5 | 2.5 | 15 | $CaZrO_3$ | 3 | anorthite | 5 | 900 | 1 | 0.114 |
| 31 | B | 74.5 | 2.5 | 5 | $CaZrO_3$ | 3 | anorthite | 15 | 900 | 1 | 0.114 |
| 32 | B | 74.5 | 2.5 | 15 | $CaZrO_3$ | 3 | surausonite | 5 | 900 | 1 | 0.114 |
| 33 | B | 74.5 | 2.5 | 5 | $CaZrO_3$ | 3 | surausonite | 15 | 900 | 1 | 0.114 |
| 34 | B | 74.5 | 2.5 | 15 | $CaZrO_3$ | 3 | celsian | 5 | 900 | 1 | 0.114 |

TABLE 6-2-continued

| Sample No. Note 1) | Glass powder Kind | Cordierite powder (mass %) | Alumina powder (mass %) | CaO-releasing filler Powder Kind | (mass %) | Filler powder Kind | (mass %) | Firing conditions Temp. (° C.) | Time (hr) | Ratio of CaO/B$_2$O$_3$ |
|---|---|---|---|---|---|---|---|---|---|---|
| 35 | B | 74.5 | 2.5 | 5 | CaZrO$_3$ | 3 | celsian | 15 | 900 | 1 | 0.114 |
| 36 | B | 74.5 | 2.5 | 15 | CaZrO$_3$ | 3 | quartz glass | 5 | 900 | 1 | 0.114 |
| 37 | B | 74.5 | 2.5 | 5 | CaZrO$_3$ | 3 | quartz glass | 15 | 900 | 1 | 0.114 |
| *38 | B | 70 | 0 | 0 | — | | ZrO$_2$ | 30 | 900 | 1 | 0 |
| *39 | B | 69.5 | 2.5 | 0 | CaZrO$_3$ | 3 | ZrO$_2$ | 25 | 900 | 1 | 0.122 |
| *40 | B | 67 | 0 | 5 | CaZrO$_3$ | 3 | ZrO$_2$ | 25 | 900 | 1 | 0.127 |
| *41 | B | 70 | 0 | 0 | — | | TiO$_2$ | 30 | 900 | 1 | 0 |
| *42 | B | 69.5 | 2.5 | 0 | CaZrO$_3$ | 3 | TiO$_2$ | 25 | 900 | 1 | 0.122 |
| *43 | B | 67 | 0 | 5 | CaZrO$_3$ | 3 | TiO$_2$ | 25 | 900 | 1 | 0.127 |
| 44 | C | 79.5 | 2.5 | 15 | CaZrO$_3$ | 3 | — | 0 | 900 | 1 | 0.107 |
| 45 | C | 77 | 5 | 15 | CaZrO$_3$ | 3 | — | 0 | 900 | 1 | 0.111 |
| 46 | C | 70 | 5 | 20 | CaZrO$_3$ | 5 | — | 0 | 900 | 1 | 0.203 |
| 47 | D | 79.5 | 2.5 | 15 | CaZrO$_3$ | 3 | — | 0 | 950 | 1 | 0.107 |
| 48 | D | 77 | 5 | 15 | CaZrO$_3$ | 3 | — | 0 | 950 | 1 | 0.111 |
| 49 | D | 72 | 5 | 20 | CaZrO$_3$ | 3 | — | 0 | 950 | 1 | 0.118 |
| *50 | E | 79.5 | 2.5 | 15 | CaZrO$_3$ | 3 | — | 0 | 900 | 1 | 0.107 |
| *51 | E | 70 | 5 | 20 | CaZrO$_3$ | 5 | — | 0 | 900 | 1 | 0.203 |
| *52 | F | 79.5 | 2.5 | 15 | CaZrO$_3$ | 3 | — | 0 | 900 | 1 | 0.107 |
| *53 | F | 70 | 5 | 20 | CaZrO$_3$ | 5 | — | 0 | 900 | 1 | 0.203 |

Note 1) Samples marked with * lie outside the scope of the invention
Note 2) Mu: mullite Co: cordierite Ga: gahnite An: anorthite Su: surausonite ZO: zirconia TO: titania Ce: celsian AK: akermanite

TABLE 7-1

| Sample No. Note 1) | Coefficient of thermal expansion x10$^{-6}$(/° C.) | Dielectric constant | Young's modulus (GPa) | Dilution in HF aqueous solution (μg/mm$^2$) | Flexural strength (MPa) | Precipitated crystal phase | Amount of cordierite crystal phase | | | Number of cycles until broken | |
|---|---|---|---|---|---|---|---|---|---|---|---|
| | | | | | | | X (mass %) | Y (mass %) | Z (mass %) | Primary mount | Secondary mount |
| *1 | 5.1 | 5.8 | 115 | 3.9 | 170 | Co>Ga>AL>ZO | 10.6 | 0.1 | 13 | 900 | OK |
| *2 | 5.3 | 5.9 | 123 | 1.8 | 240 | AL>Co>Ga>Mu>ZO | 9.1 | 0.1 | 12 | 900 | OK |
| 3 | 3.6 | 5.6 | 116 | 1.5 | 190 | Co>Ca>AL>ZO | 10.3 | 1 | 22 | OK | OK |
| 4 | 3.8 | 5.6 | 121 | 3.3 | 230 | Co>AL>Ga>ZO | 9.2 | 1 | 27 | OK | OK |
| 5 | 4.0 | 5.6 | 116 | 2.7 | 200 | Co>Ga>AL>ZO | 10.3 | 0.5 | 25 | OK | OK |
| 6 | 3.7 | 5.7 | 130 | 0.8 | 290 | Co>AL>Ga>ZO | 8.5 | 2.5 | 32 | OK | OK |
| 7 | 3.5 | 5.4 | 122 | 1.6 | 240 | Co>AL>Ga>ZO | 8.5 | 2.5 | 30 | OK | OK |
| 8 | 3.3 | 5.3 | 112 | 1.4 | 220 | Co>AL>Ga>ZO | 8.5 | 10 | 38 | OK | OK |
| 9 | 3.1 | 5.2 | 115 | 1.7 | 200 | Co>AL>Ga>ZO | 6.6 | 20 | 49 | OK | OK |
| *10 | | | | | | not sintered, could not be evaluated | | | | | |
| 11 | 3.8 | 5.9 | 136 | 1.2 | 250 | Co>AL>Ga>ZO | 7.7 | 2.5 | 30 | OK | OK |
| 12 | 4.2 | 6.0 | 145 | 1.5 | 270 | Co>AL>Ga>ZO | 6.6 | 2.5 | 29 | OK | OK |
| *13 | | | | | | not sintered, could not be evaluated | | | | | |
| 14 | 3.5 | 5.5 | 125 | 1.2 | 250 | Co>AL>Ga>ZO | 8.3 | 2.5 | 28 | OK | OK |
| 15 | 3.7 | 5.6 | 129 | 0.8 | 250 | Co>AL>Ga>ZO | 7.7 | 2.5 | 30 | OK | OK |
| 16 | 3.9 | 5.7 | 126 | 1.1 | 240 | Co>AL>ZO>Ga | 6.6 | 5 | 33 | OK | OK |
| *17 | | | | | | not sintered, could not be evaluated | | | | | |
| 18 | 3.6 | 5.7 | 128 | 0.2 | 250 | Co>AL>Ga>ZO | 13.7 | 1 | 42 | OK | OK |
| 19 | 3.4 | 5.4 | 112 | 0.3 | 240 | Co>AL>Ga>ZO | 15.2 | 2.5 | 50 | OK | OK |
| 20 | 3.2 | 5.4 | 123 | 0.8 | 260 | Co>AL>Ga>ZO | 14.2 | 2.5 | 49 | OK | OK |
| 21 | 3.4 | 5.6 | 125 | <0.1 | 270 | Co>AL>Ga>ZO | 13.9 | 2.5 | 48 | OK | OK |
| 22 | 3.6 | 5.7 | 130 | <0.1 | 280 | Co>AL>Ga>ZO | 13.4 | 2.5 | 47 | OK | OK |
| 23 | 3.4 | 5.5 | 118 | 0.2 | 240 | Co>AL>Ga>ZO | 13.9 | 5 | 52 | OK | OK |
| 24 | 3.7 | 5.6 | 123 | <0.1 | 240 | Co>AL>Ga>ZO | 13.0 | 5 | 50 | OK | OK |
| 25 | 3.2 | 5.5 | 115 | 0.3 | 240 | Co>AL>Ga>ZO | 13.9 | 2.5 | 45 | OK | OK |
| 26 | 3.2 | 5.5 | 110 | 0.8 | 220 | Co>AL>Ga>ZO | 13.5 | 2.5 | 42 | OK | OK |
| 27 | 3.3 | 5.6 | 118 | 0.5 | 230 | Co>AL>Ga>ZO | 13.5 | 2.5 | 47 | OK | OK |

Note 1) Samples marked with * lie outside the scope of the invention
Note 2) Mu: mullite Co: cordierite Ga: gahnite An: anorthite Su: surausonite ZO: zirconia TO: titania Ce: celsian AK: akermanite

TABLE 7-2

| Sample No. Note 1) | Coefficient of thermal expansion x10⁻⁶(/° C.) | Dielectric constant | Young's modulus (GPa) | Dilution in HF aqueous solution (μg/mm²) | Flexural strength (MPa) | Precipitated crystal phase | Amount of cordierite crystal phase | | | Number of cycles until broken | |
|---|---|---|---|---|---|---|---|---|---|---|---|
| | | | | | | | X (mass %) | Y (mass %) | Z (mass %) | Primary mount | Secondary mount |
| 28 | 3.4 | 5.6 | 125 | 0.3 | 280 | Co>AL>Ga>Mu>ZO | 13.4 | 2.5 | 54 | OK | OK |
| 29 | 3.2 | 5.5 | 122 | 0.8 | 260 | Co>Mu>Ga>AL>ZO | 13.4 | 2.5 | 50 | OK | OK |
| 30 | 3.5 | 5.6 | 123 | <0.1 | 260 | Co>AL>Ga>An>ZO | 13.4 | 2.5 | 45 | OK | OK |
| 31 | 3.3 | 5.6 | 119 | 0.2 | 240 | Co>An>Ga>AL>ZO | 13.4 | 2.5 | 45 | OK | OK |
| 32 | 3.5 | 5.6 | 121 | <0.1 | 240 | Co>AL>Ga>Su>ZO | 13.4 | 2.5 | 45 | OK | OK |
| 33 | 3.3 | 5.8 | 116 | 0.2 | 220 | Co>Su>Ga>AL>ZO | 13.4 | 2.5 | 45 | OK | OK |
| 34 | 3.6 | 5.7 | 128 | <0.1 | 310 | Co>AL>Ga>Ce>ZO | 13.4 | 2.5 | 42 | OK | OK |
| 35 | 3.4 | 5.7 | 125 | 0.2 | 290 | Co>Ce>Ga>AL>ZO | 13.4 | 2.5 | 42 | OK | OK |
| 36 | 3.2 | 5.2 | 116 | 0.2 | 220 | Co>AL>Ga>Mu>ZO | 13.4 | 2.5 | 45 | OK | OK |
| 37 | 2.6 | 4.9 | 112 | 0.5 | 200 | Co>Ga>AL>Mu>ZO | 13.4 | 2.5 | 45 | OK | OK |
| * 38 | 6.2 | 8.8 | 144 | 3.3 | 290 | ZO>Co>Ga>Mu | 12.6 | 0 | 12.6 | 600 | OK |
| * 39 | 5.5 | 7.9 | 139 | 1.8 | 270 | Co>ZO>Ga>Mu | 12.5 | 2.5 | 42 | 800 | OK |
| * 40 | 6.5 | 9.2 | 151 | 1.2 | 280 | ZO>Ga>Co>AL>Mu | 12.1 | 0 | 12.1 | 500 | OK |
| * 41 | 6.4 | 12.6 | 128 | 3.5 | 160 | TO>Co>Ga>Mu | 12.6 | 0 | 12.6 | 500 | OK |
| * 42 | 5.7 | 10.6 | 122 | 1.9 | 190 | Co>TO>Ga>ZO>Mu | 12.5 | 2.5 | 38 | 700 | OK |
| * 43 | 6.7 | 12.9 | 131 | 1.4 | 200 | TO>Ga>Co>AL>Mu | 12.1 | 0 | 12.1 | 500 | OK |
| 44 | 3.6 | 5.8 | 122 | 0.3 | 260 | Co>AL>Ga>ZO | 19.9 | 2.5 | 58 | OK | OK |
| 45 | 3.4 | 5.7 | 120 | 0.2 | 260 | Co>AL>Ga>ZO | 19.3 | 5 | 64 | OK | OK |
| 46 | 3.6 | 5.8 | 125 | <0.1 | 270 | Co>AL>Ga>ZO | 17.5 | 5 | 61 | OK | OK |
| 47 | 3.8 | 5.8 | 122 | <0.1 | 260 | Co>AL>Ga>ZO | 16.7 | 2.5 | 46 | OK | OK |
| 48 | 3.6 | 5.8 | 121 | <0.1 | 270 | Co>AL>Ga>ZO | 16.2 | 5 | 50 | OK | OK |
| 49 | 4.0 | 5.9 | 126 | <0.1 | 270 | Co>AL>Ga>ZO | 15.1 | 5 | 48 | OK | OK |
| * 50 | 8.6 | 7.4 | 163 | 1.9 | 360 | Ce>AL>Ga>Ga>ZO | 0 | 2.5 | 2.5 | 100 | 800 |
| * 51 | 8.5 | 7.4 | 159 | 1.0 | 350 | Ce>AL>Ga>Co>ZO | 0 | 5 | 5 | 100 | 900 |
| * 52 | 8.0 | 7.7 | 143 | 2.2 | 280 | Ak>Ga>AL>Co>ZO | 0 | 2.5 | 2.5 | 200 | 900 |
| * 53 | 7.6 | 7.6 | 139 | 1.5 | 270 | Ak>Ga>AL>Co>ZO | 0 | 5 | 5 | 300 | OK |

Note 1) Samples marked with * lie outside the scope of the invention
Note 2) Mu: mullite Co: cordierite Ga: gahnite An: anorthite Su: surausonite ZO: zirconia TO: titania Ce: celsian AK: akermanite As will be clear from the results of Tables 7-1 and 7-2, the samples Nos. 5 to 9, 11, 12, 14 to 16, 18 to 37, and 44 to 49 containing the cordierite crystal phase, gahnite crystal phase and alumina crystal phase, exhibited good values, i.e., the thermal expansion coefficients of not larger than $5 \times 10^{-6}/°$ C., dielectric constants of not larger were smaller than 7, Young's moduli of not larger than than 150 GPa, reductions in the weights of when immersed in a 1-mass % HF aqueous solution of not larger than $3.0 \mu g/mm^2$, and flexural strengths of not smaller than 200 MPa.

On the other hand, the samples Nos. 10, 13 and 17 containing the glass powder in small amounts, the sample No. 10 using the cordierite powder in an amount of more than 20 mass %, the sample No. 13 containing the alumina powder in an amount of more than 35 mass % and the sample No. 17 containing the CaO-releasing filler powder in an amount of more than 15 mass %, could not form densely sintered bodies through the firing of not higher than 1050° C.

In the samples Nos. 1 and 2 in which the amounts of the cordierite powder were smaller than 0.5 mass %, the amounts of cordierite crystals in the sintered bodies were smaller than 20 mass %, the effect for lowering the thermal expansion coefficients was insufficient, and the thermal expansion coefficients were larger than $5 \times 10^{-6}/°$ C.

In the samples Nos. 1, the amount of the alumina powder was smaller than 5 mass %, the amount of the CaO-releasing filler powder was smaller than 0.5 mass % and the ratio $(CaO/B_2O_3)$ in the total amounts were smaller than 0.01. Therefor, the flexural strength was smaller than 200 MPa, and the amount of elution in the HF aqueous solution was larger than $3.0 \mu g/mm^2$.

In the samples Nos. 38 to 43 using $ZrO_2$ and $TiO_2$ as filler powders, further, the thermal expansion coefficients were larger than $5 \times 10^{-6}/°$ C. and the dielectric constants were larger than 7.

In the samples Nos. 50 to 53 using glass powders E and F, further, the cordierite crystal phase was not precipitated from the glass, the thermal expansion coefficients were larger than $5 \times 10^{-6}/°$ C. and the dielectric constants were larger than 7.

(Experiment 3-2)

Multi-layer wiring boards were prepared in the same manner as in Experiment 1-2 with the exception of using the starting powders (mixed powders) used in Experiment 3-1 and conducting the firing under the conditions shown in Tables 6-1 and 6-2.

The obtained wiring boards were confirmed for the conduction of the wiring layers. Good conduction property was exhibited having small resistance without breakage. Even when the Ni-Au plating treatment was conducted inclusive of the treatment with the HF aqueous solution, there were obtained good wiring boards without discoloration of the ceramics, stains, or decrease in the strength of adhesion of the wiring layers.

(Experiment 3-3)

Secondarily mounted samples having the package mounted on the printed board were produced in a number of 20 in the same manner as in Experiment 1-3 with the exception of using the starting powders (mixed powders) used in Experiment 3-1 and effecting the firing under the conditions of Tables 6-1 and 6-2, and were subjected to the same temperature cycle testing as that of Experiment 1-3. The results were as shown in Tables 7-1 and 7-2.

As will be clear from the results of Tables 7-1 and 7-2, the samples precipitating particular crystal phases and having thermal expansion coefficients of not larger $5 \times 10^{-6}/°$ C. and Young's moduli of not larger than 150 GPa, did not exhibit breakage in either the primarily mounted side or the secondarily mounted side even after the temperature cycle testing of 1000 cycles, offering high mounting reliability.

In the samples having thermal expansion coefficients of larger than 5×10⁻⁶/° C., on the other hand, mismatching in the coefficient of thermal expansion between the semiconductor element and the insulating substrate was so large in the temperature cycle testing that breakage occurred after numbers of cycles smaller than 1000 cycles, and reliability in the primary mounting could not be maintained.

(Experiment 4-1)

Filler powders (average particle size of 1 to 2 μm) shown in Tables 8-1 and 8-2 were mixed into the glass powders A to F of Table 1 to accomplish compositions shown in Tables 8-1 and 8-2.

The glass ceramic sintered bodies (samples No. 1 to 44) were obtained in the same manner as in Experiment 1-1 with the exception of using the above mixtures and conducting the firing under the conditions shown in Tables 8-1 and 8-2.

The above sintered bodies were measured for their thermal expansion coefficients at 40 to 400° C., dielectric constants, Young's moduli and flexural strengths. The results were as shown in Tables 9-1 and 9-2. Further, crystal phases in the sintered bodies of the samples were identified from the X-ray diffraction measurement. The results of main peak intensities arranged in order of decreasing intensities were as shown in Tables 9-1 and 9-2.

As for the cordierite crystal phase, there were calculated the amount X of cordierite crystals precipitated from the glass depending upon the amount of addition of glass and the amount Y of the cordierite powder that was added. Further, as for the obtained sintered bodies, the content Z of the cordierite crystal phase was calculated by the Liedbert's method. The results of measurement were as shown in Tables 9-1 and 9-2.

Further, the total amounts of the cordierite crystal phase, enstatite crystal phase and forsterite crystal phase in the sintered bodies were calculated in the same manner as described above. The results were as shown in Tables 9-1 and 9-2.

TABLE 8-1

| Sample No. Note 1) | Glass powder Kind | Glass powder (mass %) | Cordierite powder (mass %) | Enstatite powder (mass %) | Forsterite powder (mass %) | Filler powder Kind | Filler powder (mass %) | Firing conditions Temp. (° C.) | Firing conditions Time (hr) |
|---|---|---|---|---|---|---|---|---|---|
| * 1 | A | 94.9 | 0.1 | 5 | 0 | | | 850 | 1 |
| 2 | A | 94.5 | 0.5 | 5 | 0 | | | 850 | 1 |
| 3 | A | 89.5 | 1 | 9.5 | 0 | | | 850 | 1 |
| 4 | A | 87.5 | 2.5 | 10 | 0 | | | 900 | 1 |
| 5 | A | 85 | 5 | 10 | 0 | | | 900 | 1 |
| 6 | A | 85 | 5 | 0 | 10 | | | 900 | 1 |
| 7 | A | 80 | 5 | 10 | 5 | | | 900 | 1 |
| 8 | A | 60 | 1 | 25 | 10 | | | 900 | 1 |
| 9 | A | 59.5 | 0.5 | 30 | 10 | | | 900 | 1 |
| 10 | A | 60 | 18 | 7 | 15 | | | 1000 | 1 |
| 11 | A | 59.5 | 20 | 7.5 | 13 | | | 1000 | 1 |
| * 12 | A | 55 | 20 | 10 | 15 | | | 1000 | 5 |
| * 13 | A | 69 | 21 | 10 | 0 | | | 1000 | 5 |
| * 14 | B | 94.9 | 0.1 | 0 | 5 | | | 850 | 1 |
| 15 | B | 87.5 | 2.5 | 10 | 0 | | | 900 | 1 |
| 16 | B | 77.5 | 2.5 | 20 | 0 | | | 900 | 1 |
| 17 | B | 67.5 | 2.5 | 30 | 0 | | | 900 | 1 |
| 18 | B | 82.5 | 2.5 | 10 | 5 | | | 900 | 1 |
| 19 | B | 85 | 5 | 10 | 0 | | | 900 | 1 |
| 20 | B | 85 | 5 | 0 | 10 | | | 900 | 1 |
| 21 | B | 80 | 5 | 10 | 5 | | | 900 | 1 |
| 22 | B | 75 | 10 | 10 | 5 | | | 900 | 1 |
| 23 | B | 77.5 | 2.5 | 10 | 0 | alumina | 10 | 900 | 1 |
| 24 | B | 77.5 | 2.5 | 10 | 0 | mullite | 10 | 900 | 1 |
| 25 | B | 77.5 | 2.5 | 10 | 0 | anorthite | 10 | 900 | 1 |
| 26 | B | 77.5 | 2.5 | 10 | 0 | surausonite | 10 | 900 | 1 |
| 27 | B | 77.5 | 2.5 | 10 | 0 | celsian | 10 | 900 | 1 |
| 28 | B | 77.5 | 2.5 | 10 | 0 | quartz glass | 10 | 900 | 1 |

Note 1) Samples marked with * lie outside the scope of the invention
Note 2) Co: cordierite Ga: gahnite En: enstatite Fo: forsterite Al: alumina Mo: mullite An: anorthite Su: surausonite ZO: zirconia TO: titania Ce: celsian AK: akermanite

TABLE 8-2

| Sample No. Note 1) | Glass powder Kind | Glass powder (mass %) | Cordierite powder (mass %) | Enstatite powder (mass %) | Forsterite powder (mass %) | Filler powder Kind | Filler powder (mass %) | Firing conditions Temp. (° C.) | Firing conditions Time (hr) |
|---|---|---|---|---|---|---|---|---|---|
| * 29 | B | 70 | 0 | 0 | 0 | $ZrO_2$ | 30 | 900 | 1 |
| * 30 | B | 70 | 0 | 0 | 0 | $TiO_2$ | 30 | 900 | 1 |
| 31 | C | 87.5 | 2.5 | 10 | 0 | | | 900 | 1 |
| 32 | C | 77.5 | 2.5 | 20 | 0 | | | 900 | 1 |
| 33 | C | 67.5 | 2.5 | 30 | 0 | | | 900 | 1 |
| 34 | C | 85 | 5 | 10 | 0 | | | 900 | 1 |
| 35 | C | 80 | 10 | 10 | 0 | | | 900 | 1 |

TABLE 8-2-continued

| Sample No. Note 1) | Glass powder Kind | Glass powder (mass %) | Cordierite powder (mass %) | Enstatite powder (mass %) | Forsterite powder (mass %) | Filler powder Kind | Filler powder (mass %) | Firing conditions Temp. (° C.) | Firing conditions Time (hr) |
|---|---|---|---|---|---|---|---|---|---|
| 36 | D | 87.5 | 2.5 | 10 | 0 | | | 950 | 1 |
| 37 | D | 77.5 | 2.5 | 20 | 0 | | | 950 | 1 |
| 38 | D | 67.5 | 2.5 | 30 | 0 | | | 950 | 1 |
| 39 | D | 85 | 5 | 10 | 0 | | | 950 | 1 |
| 40 | D | 80 | 10 | 10 | 0 | | | 950 | 1 |
| * 41 | E | 90 | 0 | 10 | 0 | | | 900 | 1 |
| * 42 | E | 85 | 5 | 10 | 0 | | | 900 | 1 |
| * 43 | F | 90 | 0 | 10 | 0 | | | 900 | 1 |
| * 44 | F | 85 | 5 | 10 | 0 | | | 900 | 1 |

Note 1) Samples marked with * lie outside the scope of the invention
Note 2) Co: cordietite Ga: gahnite En: enstatite Fo: forsterite Al: alumina Mo: mullite An: anorthite Su: surausonite ZO: zirconia TO: titania Ce: celsian AK: akermanite

TABLE 9-1

| Sample No. Note 1) | Coefficient of thermal expansion x10⁻⁶(/° C.) | Dielectric constant | Young's modulus (GPa) | Flexural strength (MPa) | Precipitated crystal phase Note 2) | Amount of cordierite crystal phase X (mass %) | Amount of cordierite crystal phase Y (mass %) | Amount of cordierite crystal phase Z (mass %) | Amount of Co + En + Fo crystal phase (mass %) | Number of cyles until broken Primary mount | Number of cyles until broken Secondary mount |
|---|---|---|---|---|---|---|---|---|---|---|---|
| * 1 | | | | | sintered body could not hold the shape, could not be evaluated | | | | | | |
| 2 | 5 | 6.5 | 150 | 270 | Co>Ga>En | 10 | 0.5 | 30.5 | 41 | OK | OK |
| 3 | 4 | 6 | 137 | 270 | Co>Ga>En | 9.845 | 1 | 30 | 39.5 | OK | OK |
| 4 | 3.9 | 5.9 | 134 | 270 | Co>Ga>En | 9.625 | 2.5 | 30 | 40 | OK | OK |
| 5 | 3.6 | 5.6 | 124 | 250 | Co>Ga>En | 9.35 | 5 | 40 | 50 | OK | OK |
| 6 | 4.2 | 5.8 | 122 | 245 | Co>Ga>En>Fo | 9.35 | 5 | 40 | 50 | OK | OK |
| 7 | 4 | 5.7 | 137 | 270 | Co>En>Ga>Fo | 8.8 | 5 | 36 | 51 | OK | OK |
| 8 | 4.4 | 6 | 140 | 270 | Co>En>Ga>Fo | 6.6 | 1 | 32 | 67 | OK | OK |
| 9 | 4.8 | 6.2 | 145 | 275 | Co>En>Ga>Fo | 6.545 | 0.5 | 30 | 70 | OK | OK |
| 10 | 4.4 | 5.9 | 140 | 265 | Co>Ga>Fo>En | 6.6 | 18 | 45 | 67 | OK | OK |
| 11 | 4.3 | 6 | 145 | 260 | Co>Ga>Fo>En | 6.6 | 20 | 50 | 70.5 | | |
| * 12 | | | | | not sintered, could not be evaluated | | | | | | |
| * 13 | | | | | not sintered, could not be evaluated | | | | | | |
| * 14 | | | | | sintered body could not hold the shape, could not be evaluated | | | | | | |
| 15 | 3.4 | 5.4 | 135 | 270 | Co>Ga>En | 15.75 | 2.5 | 48 | 58 | OK | OK |
| 16 | 3.6 | 5.4 | 140 | 275 | Co>Fo>Ga | 13.95 | 2.5 | 46 | 66 | OK | OK |
| 17 | 3.8 | 5.3 | 145 | 280 | Co>Fo>Ga | 12.15 | 2.5 | 44 | 74 | OK | OK |
| 18 | 3.7 | 5.5 | 139 | 275 | Co>Ga>Fo>En | 14.85 | 2.5 | 48 | 63 | OK | OK |
| 19 | 3.4 | 5.4 | 130 | 260 | Co>Ga>En | 15.3 | 5 | 50 | 60 | OK | OK |
| 20 | 3.9 | 5.6 | 131 | 260 | Co>Ga>Fo | 15.3 | 5 | 44 | 54 | OK | OK |
| 21 | 3.8 | 5.5 | 124 | 250 | Co>Ga>En>Fo | 14.4 | 5 | 48 | 63 | OK | OK |
| 22 | 3.7 | 5.4 | 132 | 265 | Co>Ga>En>Fo | 13.5 | 10 | 52 | 67 | OK | OK |
| 23 | 3.7 | 5.4 | 149 | 320 | Co>Ga>En>Al | 13.95 | 2.5 | 48 | 58 | OK | OK |
| 24 | 3.3 | 5.2 | 135 | 300 | Co>Ga>Mu>En | 13.95 | 2.5 | 52 | 62 | OK | OK |
| 25 | 3.5 | 5.2 | 132 | 300 | Co>Ga>An>En | 13.95 | 2.5 | 43 | 53 | OK | OK |
| 26 | 3.5 | 5.2 | 130 | 290 | Co>Ga>Su>En | 13.95 | 2.5 | 43 | 53 | OK | OK |
| 27 | 3.6 | 5.3 | 133 | 300 | Co>Ga>Ce>En | 13.95 | 2.5 | 40 | 50 | OK | OK |
| 28 | 3.1 | 4.7 | 121 | 245 | Co>Ga>En>Mu | 13.95 | 2.5 | 43 | 53 | OK | OK |

Note 1) Samples marked with * lie outside the scope of the invention
Note 2) Co: cordietite Ga: gahnite En: enstatite Fo: forsterite Al: alumina Mo: mullite An: anorthite Su: surausonite ZO: zirconia TO: titania Ce: celsian AK: akermanite

TABLE 9-2

| Sample No. Note 1) | Coefficient of thermal expansion x10⁻⁶(/° C.) | Dielectric constant | Young's modulus (GPa) | Flexural strength (MPa) | Precipitated crystal phase Note 2) | Amount of cordierite crystal phase X (mass %) | Amount of cordierite crystal phase Y (mass %) | Amount of cordierite crystal phase Z (mass %) | Amount of Co + En + Fo crystal phase (mass %) | Number of cyles until broken Primary mount | Number of cyles until broken Secondary mount |
|---|---|---|---|---|---|---|---|---|---|---|---|
| * 29 | 6.2 | 8.8 | 144 | 290 | ZO>Ga>Co | 12.6 | 0 | 12.6 | 12.6 | OK | OK |
| * 30 | 6.4 | 12.6 | 128 | 160 | TO>Ga>Co | 12.6 | 0 | 12.6 | 12.6 | OK | OK |
| 31 | 3.2 | 5.2 | 132 | 260 | Co>Ga>En | 21.875 | 2.5 | 50 | 60 | OK | OK |
| 32 | 3.3 | 5.2 | 136 | 265 | Co>En>Ga | 19.375 | 2.5 | 48 | 68 | OK | OK |
| 33 | 3.6 | 5.1 | 141 | 270 | Co>En>Ga | 16.875 | 2.5 | 47 | 77 | OK | OK |

TABLE 9-2-continued

| Sample No. Note 1) | Coefficient of thermal expansion x10⁻⁶(/° C.) | Dielectric constant | Young's modulus (GPa) | Flexural strength (MPa) | Precipitated crystal phase Note 2) | Amount of cordierite crystal phase | | | Amount of Co + En + Fo crystal phase (mass %) | Number of cyles until broken | |
|---|---|---|---|---|---|---|---|---|---|---|---|
| | | | | | | X (mass %) | Y (mass %) | Z (mass %) | | Primary mount | Secondary mount |
| 34 | 3.2 | 5.2 | 126 | 260 | Co>Ga>En | 21.25 | 5 | 52 | 62 | OK | OK |
| 35 | 3.4 | 5.2 | 123 | 250 | Co>Ga>En | 20 | 10 | 54 | 64 | OK | OK |
| 36 | 3.5 | 5.3 | 134 | 270 | Co>Ga>En | 18.375 | 2.5 | 48 | 58 | OK | OK |
| 37 | 3.6 | 5.3 | 138 | 275 | Co>En>Ga | 16.275 | 2.5 | 46 | 66 | OK | OK |
| 38 | 3.9 | 5.3 | 143 | 280 | Co>En>Ga | 14.175 | 2.5 | 45 | 75 | OK | OK |
| 39 | 3.5 | 5.4 | 129 | 260 | Co>Ga>En | 17.85 | 5 | 50 | 60 | OK | OK |
| 40 | 3.6 | 5.3 | 130 | 260 | Co>Ga>En | 16.8 | 10 | 52 | 62 | OK | OK |
| * 41 | 7.7 | 7.2 | 157 | 330 | Ce>Ga>En | 0 | 0 | 0 | 10 | 100 | 900 |
| * 42 | 7.8 | 7.1 | 155 | 300 | Ce>Ga>Co>En | 0 | 5 | 5 | 15 | 200 | 900 |
| * 43 | 7.7 | 7.5 | 140 | 270 | Ak>Ga>En | 0 | 0 | 0 | 10 | 300 | OK |
| * 44 | 7.5 | 7.4 | 136 | 260 | Ak>Ga>Co>En | 0 | 5 | 5 | 15 | 300 | OK |

Note 1) Samples marked with * lie outside the scope of the invention
Note 2) Co: cordierite Ga: gahnite En: enstatite Fo: forsterite Al: alumina Mo: mullite An: anorthite Su: surausonite ZO: zirconia TO: titania Ce: celsian AK: akermanite As will be clear from the results of Tables 9-1 and 9-2, the samples Nos. 2 to 11, 15 to 28 and 31 to 40 in which the cordierite and gahnite phases were precipitated, or enstatite or forsterite crystal phases were precipitate, exhibited good values, i.e., the thermal expansion coefficients of not larger than $5 \times 10^{-6}/°$ C., dielectric constants of not larger than 7, Young's moduli of not larger than 150 GPa, and flexural strengths of not smaller than 200 MPa. In particular, the samples Nos. 3 to 8, 10, 15 to 28 and 31 to 40 using the cordierite powder in amounts of 1 to 18 mass %, and enstatite powder and/or forsterite powder in amounts of 9.5 to 35% by mass, exhibited the coefficients of thermal expansion of not larger than $4.4 \times 10^{-6}/°$ C., dielectric constants of not larger than 6, Young's moduli of not larger than 140 GPa, and flexural strengths of not smaller than 240 MPa.

In the samples Nos. 23 to 27 containing alumina, mullite, anorthite and celsian as filler powders, further, the Young's moduli could be decreased to be not larger than 140 MPa while maintaining the flexural strengths of not smaller than 290 MPa.

On the other hand, in the samples Nos. 1 and 14 containing the filler powder in small amounts, the glass was softened and flew so conspicuously that the sintered bodies could not hold their shapes and the samples could not be evaluated. Further, the sample No. 12 using the glass powder in an amount of smaller than 59.5 mass % and the sample No. 13 containing the cordierite powder in an amount of larger than 20 mass %, could not form densely sintered bodies through the firing at not higher than 1050° C.

In the samples Nos. 29 and 30 using $ZrO_2$ and $TiO_2$, the thermal expansion coefficients were larger than $5 \times 10^{-6}/°$ C. and the dielectric constants were larger than 7.

In the samples Nos. 41 to 44 using glass powders E and F, further, the cordierite crystal phase was not precipitated from the glass and the thermal expansion coefficients were larger than $5 \times 10^{-6}/°$ C.

(Experiment 4-2)

Multi-layer wiring boards were prepared in the same manner as in Experiment 1-2 with the exception of using the starting powders (mixed powders) used in Experiment 4-1 and conducting the firing under the conditions shown in Tables 8-1 and 8-2.

The obtained wiring boards were confirmed for the conduction of the wiring layers. Good conduction property was exhibited having small resistance without breakage.

(Experiment 4-3)

Secondarily mounted samples having the package mounted on the printed board were produced in a number of 20 in the same manner as in Experiment 1-3 with the exception of using the starting powders (mixed powders) used for the samples of Experiment 4-1 and effecting the firing under the conditions of Tables 8-1 and 8-2, and were subjected to the same temperature cycle testing as that of Experiment 1-3. The results were as shown in Tables 9-1 and 9-2.

As will be clear from the results of Tables 9-1 and 9-2, the samples precipitating particular crystal phases and having thermal expansion coefficients of not larger $5 \times 10^{-6}/°$ C. and Young's moduli of not larger than 150 GPa, did not exhibit breakage in either the primarily mounted side or the secondarily mounted side even after the temperature cycle testing of 1000 cycles, offering high mounting reliability.

In the samples having coefficients of thermal expansion of larger than $5 \times 10^{-6}/°$ C., on the other hand, mismatching in the thermal expansion coefficient between the semiconductor device and the insulating substrate was so large in the temperature cycle testing that breakage occurred after numbers of cycles smaller than 1000 cycles, and reliability in the primary mounting could not be maintained.

What is claimed is:

1. A glass ceramic sintered body comprising gahnite and cordierite as crystal phases, having a thermal expansion coefficient at 40 to 400° C. of not larger than $5 \times 10^{-6}/°$ C. a dielectric constant of not larger than 7 and a Young's modulus of not larger than 150 GPa. obtained by firing a mixed powder of a glass powder having the following composition:

$SiO_2$: 30 to 55 mass %
$Al_2O_3$: 15 to 40 mass %
MgO: 3 to 25 mass %
ZnO: 2 to 15 mass %
$B_2O_3$: 2 to 15 mass % and a filler powder, wherein the glass ceramic sintered body further comprising a CaO-containing glass phase.

2. A glass ceramic sintered body according to claim 1, wherein the flexural strength is not smaller than 150 MPa.

3. A glass ceramic sintered body according to claim 1, comprising PbO not larger than 0.1 mass % and an alkali metal oxide not larger than 0.1 mass.

4. A glass ceramic sintered body according to claim 1, further comprising at least one crystal phase selected from the group consisting of alumina, spinel, mullite, anorthite, slawsonite, celsian and zirconia.

5. A glass ceramic sintered body according to claim 1, comprising a cordierite crystal phase in an amount of not smaller than 20 mass % and having a thermal expansion coefficient at 40 to 4000° C. of not larger than $4.5 \times 10^{-6}$/° C.

6. A glass ceramic sintered body according to claim 5, comprising, as said filler powder, at least one inorganic powder for adjusting properties selected from the group consisting of mullite, anorthite, slawsonite, celsian and quartz glass, and further comprising a cordierite powder.

7. A glass ceramic sintered body according to claim 1, further comprising alumina as a crystal phase.

8. A glass ceramic sintered body according to claim 7, wherein the flexural strength is not smaller than 200 MPa, and a reduction in the weight of when immersed in a 1-mass % HF aqueous solution for one minute is not larger than 3 $\mu g/mm^2$.

9. A glass ceramic sintered body according to claim 8, wherein the filler powder comprises a CaO-releasing Ca compound powder, a cordierite powder and an alumina powder.

10. A glass ceramic sintered body according to claim 1, further comprising, enstatite and/or forsterite as crystal phases, the content the cordierite is not smaller than 20 mass %, and the total content of the cordierite, enstatite and/or forsterite is not smaller than 40 mass %.

11. A glass ceramic sintered body according to claim 10, wherein the flexural strength is not smaller than 200 MPa, and the filler powder comprises cordierite, enstatite and/or forsterite.

12. A wiring board having wiring layers of a low-resistance metal arranged a the front surface and/or inside of an insulating substrate made of a glass ceramic sintered body of claim 1.

13. A wiring board according to claim 12, wherein a semiconductor device comprising chiefly silicon is arranged on the surface of said insulating substrate.

14. A wiring board according to claim 13, wherein a recessed portion is formed in the surface of said insulating substrate, and a semiconductor device comprising chiefly silicon is arranged in said recessed portion.

15. A mounted structure of a wiring board obtained by mounting a wiring board of claim 12 on the surface of a printed wiring board that has an insulating substrate containing an organic resin.

* * * * *